(12) United States Patent
Shu et al.

(10) Patent No.: US 11,387,305 B2
(45) Date of Patent: Jul. 12, 2022

(54) DISPLAY SUBSTRATE, DISPLAY PANEL, DISPLAY APPARATUS, AND METHOD OF FABRICATING DISPLAY SUBSTRATE

(71) Applicant: BOE Technology Group Co., Ltd., Beijing (CN)

(72) Inventors: Shi Shu, Beijing (CN); Jiangnan Lu, Beijing (CN); Xing Zhang, Beijing (CN); Wei Liu, Beijing (CN); Zhengliang Li, Beijing (CN); Cuili Gai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 449 days.

(21) Appl. No.: 16/475,471

(22) PCT Filed: Aug. 10, 2018

(86) PCT No.: PCT/CN2018/099963
§ 371 (c)(1),
(2) Date: Jul. 2, 2019

(87) PCT Pub. No.: WO2020/029250
PCT Pub. Date: Feb. 13, 2020

(65) Prior Publication Data
US 2021/0351256 A1    Nov. 11, 2021

(51) Int. Cl.
*H01L 27/32* (2006.01)
*H01L 51/56* (2006.01)
*H01L 29/786* (2006.01)

(52) U.S. Cl.
CPC ........ *H01L 27/3272* (2013.01); *H01L 27/322* (2013.01); *H01L 27/3269* (2013.01); *H01L 51/56* (2013.01); *H01L 2227/323* (2013.01)

(58) Field of Classification Search
CPC ............... H01L 27/3272; H01L 27/322; H01L 27/3269; H01L 51/56
See application file for complete search history.

(56) References Cited

U.S. PATENT DOCUMENTS 4,888,246 A  * 12/1989  Kuwata ................. C23C 14/088
                                                    428/432
6,525,788 B1     2/2003  Nakagawa et al.
(Continued)

FOREIGN PATENT DOCUMENTS

JP      H09160014 A       6/1997
JP      2000122089 A      4/2000
(Continued)

OTHER PUBLICATIONS

Tamahiko et al. English Machine translated of Publication No. JP2001343668, Dec. 14, 2001; (Machine translated Jan. 14, 2022). (Year: 2001).*

(Continued)

*Primary Examiner* — Mohsen Ahmadi
(74) *Attorney, Agent, or Firm* — Intellectual Valley Law, P.C.

(57) ABSTRACT

The present application provides a display substrate having a plurality of subpixel areas. The display substrate includes a base substrate; a plurality of thin film transistors on the base substrate; and a plurality of semiconductor junctions configured to shield light from irradiating on active layers of the plurality of thin film transistors.

19 Claims, 22 Drawing Sheets

(56) References Cited

U.S. PATENT DOCUMENTS

| | | |
|---|---|---|
| 7,558,445 B2 | 7/2009 | Yasukawa |
| 10,276,642 B2 * | 4/2019 | Tang .................... H01L 27/3248 |
| 10,693,012 B2 * | 6/2020 | Asami ............... H01L 29/78603 |
| 2001/0009283 A1 | 7/2001 | Arao et al. |
| 2009/0142909 A1 * | 6/2009 | Jinbo .................. H01L 21/0262 |
| | | 257/E21.09 |
| 2010/0102303 A1 * | 4/2010 | Nomura ............... C07D 405/06 |
| | | 546/76 |
| 2014/0158859 A1 * | 6/2014 | Fukuzaki ................ H01L 51/44 |
| | | 257/40 |
| 2018/0159039 A1 * | 6/2018 | Yoshioka .............. H01L 27/307 |
| 2018/0226604 A1 * | 8/2018 | Gong .................. H01L 51/5259 |
| 2018/0350310 A1 * | 12/2018 | Xiao .................... G09G 3/3225 |
| 2019/0080136 A1 * | 3/2019 | Wu ..................... H01L 27/3227 |

FOREIGN PATENT DOCUMENTS

| | | |
|---|---|---|
| JP | 2000122097 A | 4/2000 |
| JP | 2001343668 A | 12/2001 |

OTHER PUBLICATIONS

International Search Report & Written Opinion dated May 8, 2019, regarding PCT/CN2018/099963.

\* cited by examiner

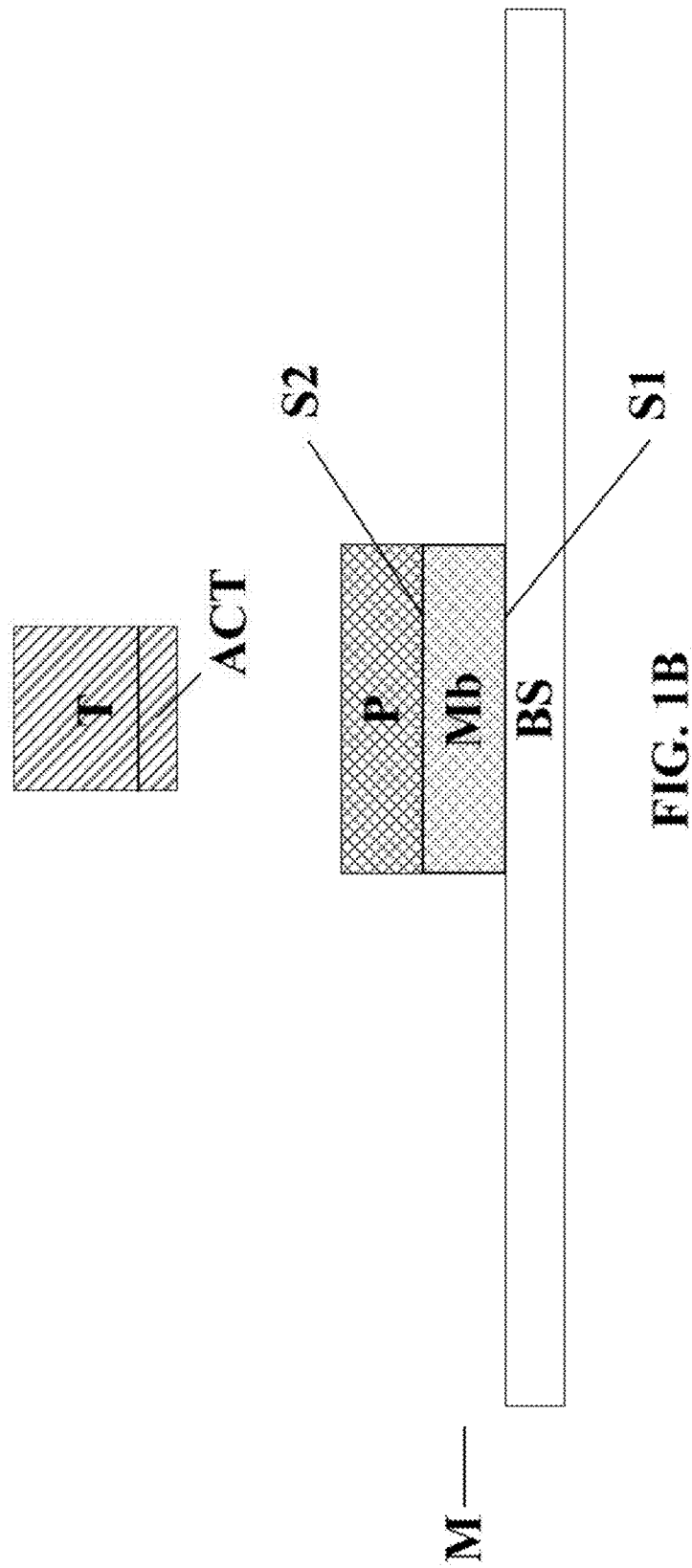

DISPLAY SUBSTRATE, DISPLAY PANEL, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2018/099963, filed Aug. 10, 2018, the contents of which are incorporated by reference in the entirety.

TECHNICAL FIELD

The present invention relates to display technology, more particularly, to a display substrate, a display panel, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides a display substrate having a plurality of subpixel areas, comprising a base substrate; a plurality of thin film transistors on the base substrate; and a plurality of semiconductor junctions configured to shield light from irradiating on active layers of the plurality of thin film transistors.

Optionally, orthographic projections of at least some of the plurality of semiconductor junctions on the base substrate respectively cover orthographic projections of the active layers of the plurality of thin film transistors on the base substrate.

Optionally, at least some of the plurality of semiconductor junctions are respectively on a side of the active layers of the plurality of thin film transistor facing the base substrate.

Optionally, the display substrate further comprises a light shielding layer; wherein the light shielding layer and the plurality of semiconductor junctions are configured to cooperatively shield light from irradiating on the active layers of the plurality of thin film transistors.

Optionally, an orthographic projection of the light shielding layer on the base substrate covers orthographic projections of the active layers of the plurality of thin film transistors on the base substrate; and orthographic projections of at least some of the plurality of semiconductor junctions on the base substrate respectively cover orthographic projections of the active layers of the plurality of thin film transistors on the base substrate.

Optionally, the plurality of thin film transistors comprises an array of a plurality of first thin film transistors on the base substrate and respectively in the plurality of subpixel areas for driving light emission of the display substrate; wherein the plurality of semiconductor junctions comprises a plurality of first semiconductor junctions respectively in the plurality of subpixel areas; and orthographic projections of the plurality of first semiconductor junctions on the base substrate respectively covers orthographic projections of first active layers of the plurality of first thin film transistors on the base substrate.

Optionally, the light shielding layer comprises a plurality of first light shielding blocks respective in the plurality of subpixel areas; orthographic projections of the plurality of first light shielding blocks on the base substrate respectively covers orthographic projections of first active layers of the plurality of first thin film transistors on the base substrate; the plurality of first semiconductor junctions and the plurality of first light shielding blocks are configured to cooperatively shield light from irradiating on the first active layers of the plurality of first thin film transistors.

Optionally, the display substrate further comprises a plurality of light emitting brightness value detectors including a plurality of second thin film transistors respectively electrically connected to a plurality of second semiconductor junctions; wherein the plurality of second semiconductor junctions are respectively configured to detect light emitting brightness values in the plurality of subpixel areas of the display substrate, respectively.

Optionally, orthographic projections of the plurality of second semiconductor junctions on the base substrate respectively covers orthographic projections of second active layers of the plurality of second thin film transistors on the base substrate; the light shielding layer comprises a plurality of second light shielding blocks; orthographic projections of the plurality of second light shielding blocks on the base substrate respectively covers orthographic projections of the second active layers of the plurality of second thin film transistors on the base substrate; and the plurality of second semiconductor junctions and the plurality of second light shielding blocks are configured to cooperatively shield light from irradiating on the second active layers of the plurality of second thin film transistors.

Optionally, the plurality of second light shielding blocks are respectively electrically connected to source electrodes of the plurality of second thin fin transistors, and are respectively electrically connected to the plurality of second semiconductor junctions.

Optionally, the plurality of semiconductor junctions further comprises a plurality of third semiconductor junctions; and orthographic projections of the plurality of third semiconductor junctions on the base substrate respectively covers orthographic projections of second active layers of the plurality of second thin film transistors on the base substrate.

Optionally, the light shielding layer comprises a plurality of third light shielding blocks; orthographic projections of the plurality of third light shielding blocks on the base substrate respectively covers orthographic projections of the second active layers of the plurality of second thin film transistors on the base substrate; and the plurality of third semiconductor junctions and the plurality of third light shielding blocks are configured to cooperatively shield light from irradiating on the second active layers of the plurality of second thin film transistors.

Optionally, the plurality of semiconductor junctions further comprises a plurality of third semiconductor junctions; orthographic projections of the plurality of third semiconductor junctions on the base substrate respectively covers orthographic projections of second active layers of the plurality of second thin film transistors on the base substrate; the light shielding layer comprises a plurality of second light shielding blocks; orthographic projections of the plurality of second light shielding blocks on the base substrate respectively covers orthographic projections of the second active layers of the plurality of second thin film transistors on the base substrate; the orthographic projections of the plurality of second light shielding blocks on the base substrate at least partially respectively overlap with orthographic projections of the plurality of second semiconductor junctions on the base substrate; the plurality of third semiconductor junctions and the plurality of second light shielding blocks are configured to cooperatively shield light from irradiating on the second active layers of the plurality of second thin film transistors.

Optionally, the plurality of second light shielding blocks are respectively electrically connected to source electrodes of the plurality of second thin film transistors, and are respectively electrically connected to the plurality of second semiconductor junctions.

Optionally, the plurality of second semiconductor junctions are respectively adjacent to the plurality of third semiconductor junctions; each individual one of the plurality of second semiconductor junctions is spaced apart and insulated from a respective one of the plurality of third semiconductor junctions.

Optionally, each individual one of the plurality of second semiconductor junctions is spaced apart from the respective one of the plurality of third semiconductor junctions by a groove; wherein the display substrate further comprises an insulating layer extending into the groove, thereby insulating each individual one of the plurality of second semiconductor junctions from the respective one of the plurality of third semiconductor junctions; wherein a source electrode of each individual one of the plurality of second thin film transistors is electrically connected to a respective one of the plurality of second light shielding blocks through the groove; the insulating layer insulates the source electrode from a respective one of the plurality of second semiconductor junctions; and the plurality of second light shielding blocks are respectively electrically connected to source electrodes of the plurality of second thin film transistors, and are respectively electrically connected to the plurality of second semiconductor junctions.

Optionally, an orthographic projection of the source electrode of each individual one of the plurality of second thin film transistors on the base substrate is substantially non-overlapping with an orthographic projection of the respective one of the plurality of second semiconductor junctions on the base substrate.

Optionally, the display substrate further comprises a color filter; wherein an orthographic projection of the color filter on the base substrate is substantially non-overlapping with orthographic projections of the plurality of second semiconductor junctions on the base substrate.

Optionally, the display substrate further comprises a plurality of read lines for respectively transmitting signals detected by the plurality of light emitting brightness value detectors; and a compensation circuit connected to the plurality of read lines, and configured to adjust in real time the light emitting brightness values of the plurality of subpixel areas to target brightness values.

Optionally, the display substrate further comprises a common electrode configured to be provided with a common voltage signal; wherein each of the plurality of second semiconductor junctions comprises a first polarity region connected to the common electrode, and a second polarity region connected to a source electrode of a respective one of the plurality of second thin film transistors, and a diode junction connecting the first polarity region and the second polarity region; each of the plurality of second thin film transistors comprises a gate electrode, a source electrode connected to a second polarity region of a respective one of the plurality of second semiconductor junctions, and a drain electrode connected to a respective one of the plurality of read lines.

Optionally, the display substrate is an organic light emitting diode display substrate comprising a plurality of organic light emitting diodes; and the plurality of light emitting brightness value detectors are configured to detect light emitting brightness values of the plurality of organic light emitting diodes respectively.

Optionally, each of the plurality of semiconductor junctions is a PN photodiode, the first polarity region is a P+ doping semiconductor region, and the second polarity region is an N+ doping semiconductor region.

Optionally, each of the plurality of semiconductor junctions is a PIN photodiode, the first polarity region is a P+ doping semiconductor region, and the second polarity region is an N+ doping semiconductor region, the PIN photodiode further comprises an intrinsic region of amorphous silicon between the P+ doping semiconductor region and the N+ doping semiconductor region.

Optionally, the display substrate is an array substrate.

In another aspect, the present invention provides a display panel comprising the display substrate described herein or fabricated by a method described herein.

In another aspect, the present invention provides a display apparatus comprising the display panel described herein.

Optionally, the display apparatus further comprises a compensation circuit configured to receive in real time light emitting brightness values of the plurality of subpixel areas, and configured to adjust in real time the light emitting brightness values of the plurality of subpixel areas to target brightness values.

In another aspect, the present invention provides a method of fabricating a display substrate having a plurality of subpixel areas, comprising forming a plurality of thin film transistors on a base substrate; forming a light shielding layer; and forming a plurality of semiconductor junctions; wherein the light shielding layer and the plurality of semiconductor junctions are formed to cooperatively shield light from irradiating on active layers of the plurality of thin film transistors.

BRIEF DESCRIPTION OF THE FIGURES

The following drawings are merely examples for illustrative purposes according to various disclosed embodiments and are not intended to limit the scope of the present invention.

FIG. 1B is a zoom-in view of FIG. 1A.

DETAILED DESCRIPTION

Figure 1A:
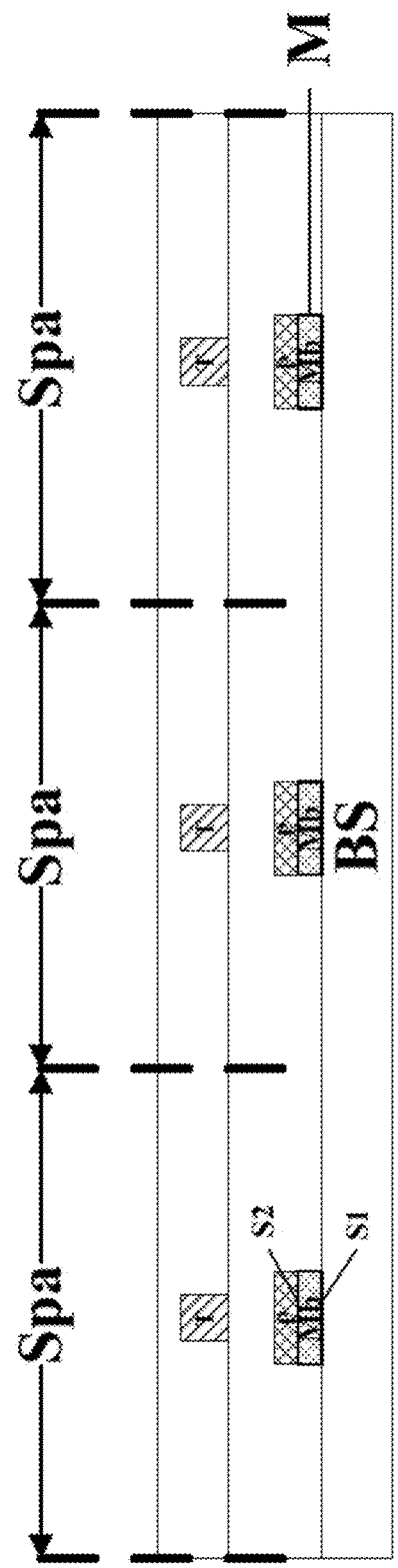
FIG. 1A is a schematic diagram illustrating the structure of a display substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In an organic light emitting diode display apparatus, light emission intensity is affected by many factors. For example, drifting of the threshold voltage, a shift of driving current, as well as a change in the mobility rate of the thin film transistors, can affect the brightness of the display. The compensation of the light emission in the organic light emitting diode display apparatus can be achieved by either an internal compensation method or an external compensation method. These compensation methods can at least partially address the issues related to the drifting of the threshold voltage, the shift of driving current, and the change in the mobility rate of the thin film transistors. However, these compensation methods cannot compensate display problems due to a decrease in light emission efficiency of the organic light emitting diode.

Accordingly, the present disclosure provides, inter alia, a display substrate, a display panel, a display apparatus, and a method of fabricating a display substrate that substantially obviate one or more of the problems due to limitations and disadvantages of the related art. In one aspect, the present disclosure provides a display substrate having a plurality of subpixel areas. In some embodiments, the display substrate includes a base substrate; a plurality of thin film transistors on the base substrate; and a plurality of semiconductor junctions. The plurality of semiconductor junctions are configured to shield light from irradiating on active layers of the plurality of thin film transistors. Optionally, orthographic projections of at least some of the plurality of semiconductor junctions on the base substrate respectively cover orthographic projections of the active layers of the plurality of thin film transistors on the base substrate. Optionally, at least some of the plurality of semiconductor junctions are respectively on a side of the active layers of the plurality of thin film transistor facing the base substrate.

As used herein, the term "semiconductor junction" refers to a junction formed within a semiconductor material between two differently doped regions thereof. A junction between a p-doped region and an n-doped region of the semiconductor material is referred to as a p-n semiconductor junction or simply a p-n junction. The p-n junction includes asymmetrically doped semiconductor junctions such as, but not limited to, p+-n junctions where 'p+' denotes a relatively higher concentration of the p-type dopant or impurity compared to the n-type dopant or impurity. A semiconductor junction in which an intrinsically doped region (i-region) lies between and separates the p-doped region (or 'p-region') and the n-doped region (or 'n-region') is generally referred to herein as a p-i-n semiconductor junction or simply a p-i-n junction. The term "semiconductor junction" as used herein also refers to complex junctions that may include one or more of layers of different semiconductor materials (e.g., GaAs and GaAlAs), layers of different doping concentrations (e.g., p, p+, p−, p++, n, n+, n−, n++, i, etc.), and doping concentration gradients within and across layers. Further herein, an "intrinsically" doped semiconductor or a related "intrinsic" one of region, layer, and semiconductor is defined as a semiconductor or semiconductor region having a doping concentration that is either essentially undoped (e.g., not intentionally doped) or relatively lightly doped when compared to doping concentrations present in other layers or regions of the semiconductor junction (e.g., p-doped regions or n-doped regions). Examples of semiconductor junctions include ones in a photosensor (either active or dummy).

In some embodiments, the display substrate further includes a light shielding layer. Optionally, the light shielding layer and the plurality of semiconductor junctions are configured to cooperatively shield light from irradiating on active layers of the plurality of thin film transistors. In one example, the light shielding layer has a first side facing away the active layers and a second side facing the active layers. The first side of the light shielding layer is configured to shield (for example, by reflection) light transmitting along a direction from the first side toward the active layers. The plurality of semiconductor junctions are configured to absorb light transmitting toward the second side of the light shielding layer (e.g., internally reflected light) so that the light is not reflected by the second side. The plurality of semiconductor junctions reduce light reflected by the second side toward the active layers. Accordingly, by having the light shielding layer reflecting (external) light on the first side, and having the plurality of semiconductor junctions absorbing (internal) light on the second side, the light shielding layer and the plurality of semiconductor junctions are configured to cooperatively shield light from irradiating on active layers of the plurality of thin film transistors.

Optionally, an orthographic projection of the light shielding layer on the base substrate covers orthographic projections of the active layers of the plurality of thin film transistors on the base substrate. Optionally, orthographic projections of at least some of the plurality of semiconductor junctions on the base substrate respectively cover orthographic projections of the active layers of the plurality of thin film transistors on the base substrate. Optionally, at least some of the plurality of semiconductor junctions are dummy semiconductor junctions. As used herein, the term "dummy" refers to a semiconductor junction that has a structure that is the same as or similar to an active semiconductor junction, but the structure is only used for a configuration existing as a pattern, without actually performing a function in the display substrate. Thus, an electrical signal may not be applied to a "dummy" semiconductor junction or even in a case in which an electrical signal is applied thereto, the "dummy" semiconductor junction may not perform an electrically equivalent function. Optionally, the display substrate is an array substrate. Optionally, the display substrate is a counter substrate.

Optionally, some or all of the plurality of thin film transistors are a plurality of bottom gate-type thin film transistors. Optionally, each of the plurality of bottom gate-type thin film transistors includes a gate electrode on the base substrate, a gate insulating layer on a side of the gate electrode distal to the base substrate, an active layer on a side of the gate insulating layer distal to the gate electrode, a source electrode and a drain electrode on a side of the active layer distal to the base substrate.

Optionally, some or all of the plurality of thin film transistors are a plurality of top gate-type thin film transistors. Optionally, each of the plurality of top gate-type thin film transistors includes an active layer on the base substrate, a gate insulating layer on a side of the active layer distal to the base substrate, a gate electrode on a side of the gate insulating layer distal to on the active layer, a source electrode and a drain electrode on a side of the gate electrode distal to the base substrate and connected to the active layer through vias extending through the gate insulating layer.

FIG. 1A is a schematic diagram illustrating the structure of a display substrate in some embodiments according to the present disclosure. FIG. 1B is a zoom-in view of FIG. 1A. Referring to FIG. 1A and FIG. 1B, the display substrate has a plurality of subpixel areas Spa. In some embodiments, the display substrate includes a base substrate BS; a plurality of thin film transistors T on the base substrate BS; a light shielding layer M; and a plurality of semiconductor junctions P. The light shielding layer M and the plurality of semiconductor junctions P are configured to cooperatively shield light from irradiating on active layers ACT of the plurality of thin film transistors T. The light shielding layer M includes a plurality of light shielding blocks Mb. Each of the light shielding blocks Mb has a first side S1 facing away the active layers ACT and a second side S2 facing the active layers ACT. The first side S1 is configured to shield (for example, by reflection) light transmitting along a direction from the first side S1 toward the active layers ACT. The plurality of semiconductor junctions P are configured to absorb light transmitting toward the second side S2 (e.g., internally reflected light) so that the light is not irradiated to the active layer ACT. The plurality of semiconductor junctions P reduce light reflected by the second side S2 toward the active layers ACT. Accordingly, by having the light shielding layer M reflecting (external) light on the first side S1, and having the plurality of semiconductor junctions P absorbing (internal) light on the second side S2, the light shielding layer M and the plurality of semiconductor junctions P are configured to cooperatively shield light from irradiating on active layers ACT of the plurality of thin film transistors T.

Optionally, an orthographic projection of the light shielding layer M on the base substrate BS covers orthographic projections of the active layers ACT of the plurality of thin film transistors T on the base substrate BS. Optionally, orthographic projections of at least some of the plurality of semiconductor junctions P on the base substrate BS respectively cover orthographic projections of the active layers ACT of the plurality of thin film transistors T on the base substrate BS. Optionally, at least some of the plurality of semiconductor junctions P are dummy semiconductor junctions. For example, each of the plurality of semiconductor junctions P is floating, and not electrically connected to a circuit.

The plurality of thin film transistors T may be any appropriate type of thin film transistors. Optionally, the plurality of thin film transistors T include a plurality of driving thin film transistors. Optionally, the plurality of thin film transistors T include a plurality of switching thin film transistors. Optionally, the plurality of thin film transistors T include a plurality of thin film transistors in a gate-on-array circuit.

Figure 2A:
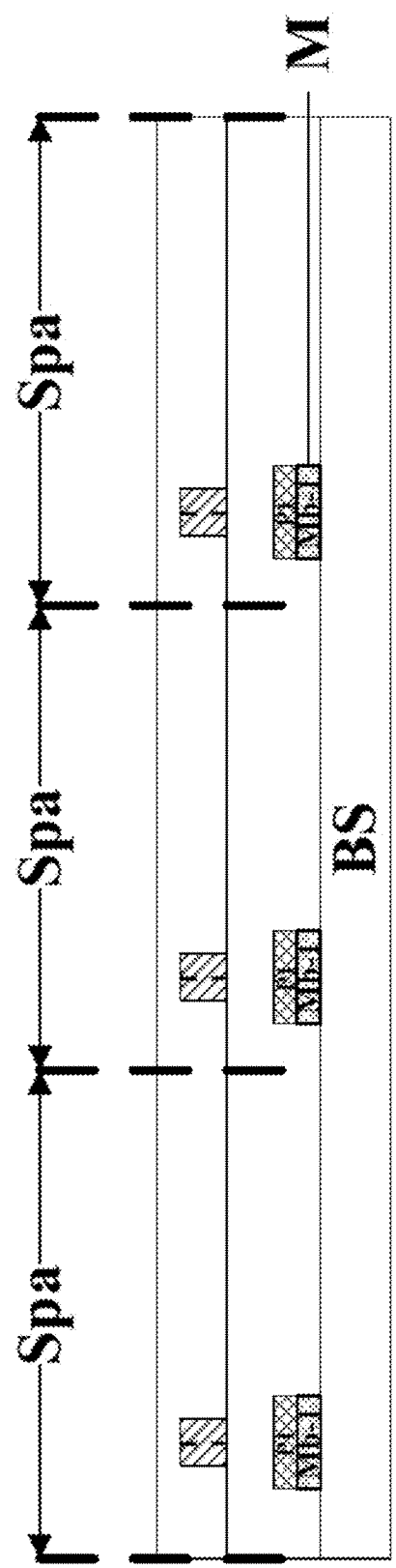
FIG. 2A is a schematic diagram illustrating the structure of a display substrate in some embodiments according to the present disclosure.
Figure 2B:
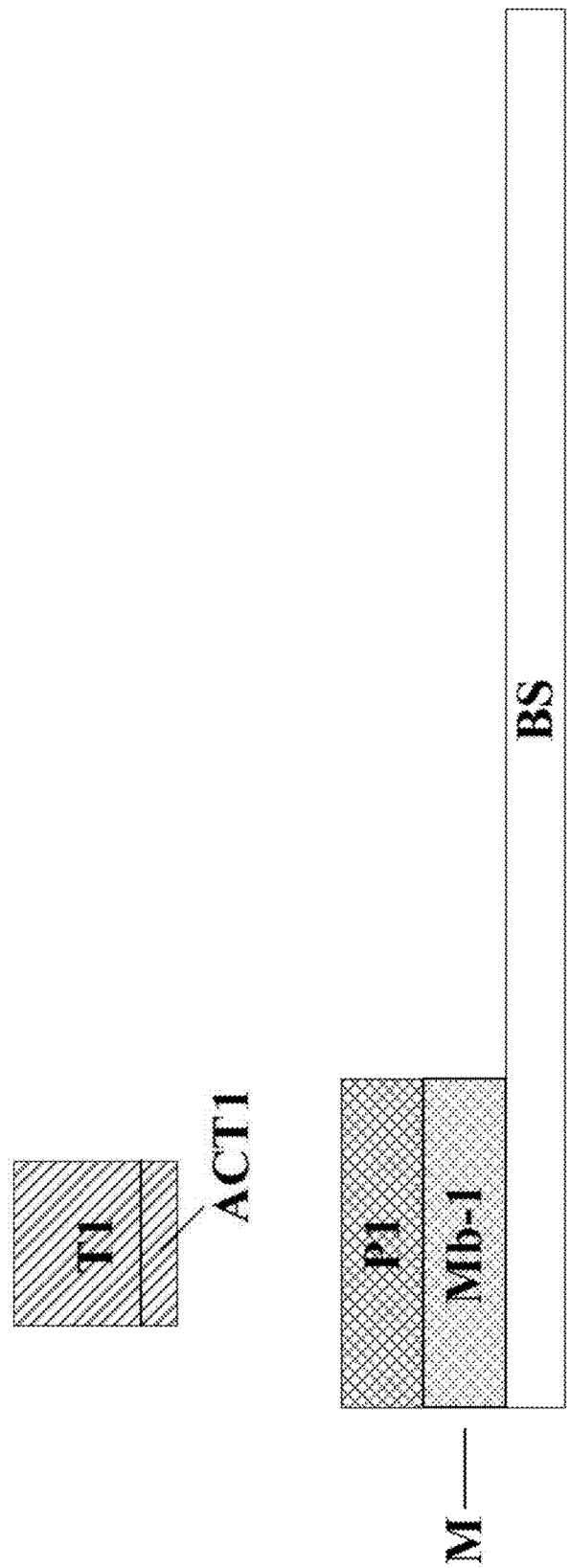
FIG. 2B is a zoom-in view of FIG. 2A.

FIG. 2A is a schematic diagram illustrating the structure of a display substrate in some embodiments according to the present disclosure. FIG. 2B is a zoom-in view of FIG. 2A. Referring to FIG. 2A and FIG. 2B, the plurality of thin film transistors include an array of a plurality of first thin film transistors T1 on the base substrate BS and respectively in the plurality of subpixel areas Spa for driving light emission of the display substrate. The plurality of semiconductor junctions include a plurality of first semiconductor junctions P1 respectively in the plurality of subpixel areas Spa. As shown in FIG. 2A and FIG. 2B, orthographic projections of the plurality of first semiconductor junctions P1 on the base substrate BS respectively covers orthographic projections of the first active layers ACT1 of the plurality of first thin film transistors T1 on the base substrate BS. Optionally, the plurality of first semiconductor junctions P1 are dummy semiconductor junctions. For example, each of the plurality of first semiconductor junctions P1 is floating, and not electrically connected to a circuit.

Referring to FIG. 2A and FIG. 2B, the light shielding layer M in some embodiments includes a plurality of first light shielding blocks Mb-1 respective in the plurality of subpixel areas Spa. Orthographic projections of the plurality of first light shielding blocks Mb-1 on the base substrate BS respectively covers orthographic projections of the first active layers ACT1 of the plurality of first thin film transistors T1 on the base substrate BS. The plurality of first semiconductor junctions P1 and the plurality of first light shielding blocks Mb-1 are configured to cooperatively shield light from irradiating on the first active layers ACT1 of the plurality of first thin film transistors T1.

Figure 7:
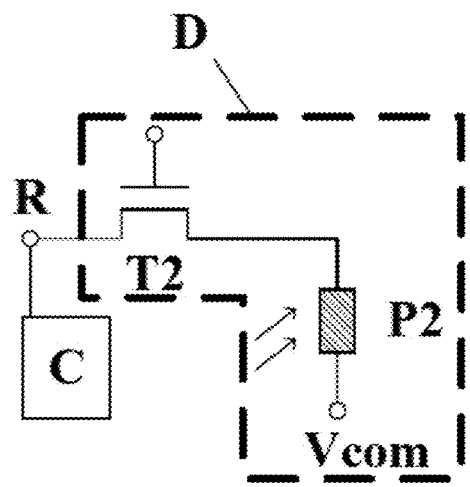
FIG. 7 is a circuit diagram of a light emitting brightness value detector in some embodiments according to the present disclosure.

In some embodiments, the display substrate further includes a plurality of light emitting brightness value detectors including a plurality of second thin film transistors respectively electrically connected to a plurality of second semiconductor junctions. FIG. 7 is a circuit diagram of a light emitting brightness value detector in some embodiments according to the present disclosure. Referring to FIG. 7, each of the plurality of light emitting brightness value detectors D includes one of a plurality of second thin film transistors T2 electrically connected to one of the plurality of second semiconductor junctions P2. The source electrode of the one of the plurality of second thin film transistors T2 is electrically connected to the one of the plurality of second semiconductor junctions P2. The drain electrode of the one of the plurality of second thin film transistors T2 is electrically connected to one of a plurality of read line R, which in turn is connected to a compensation circuit C. The compensation circuit C is configured to receive in real time the light emitting brightness values of the plurality of subpixel areas, and configured to adjust in real time the light emitting brightness values of the plurality of subpixel areas to target brightness values.

Various appropriate semiconductor junctions may be utilized in making the present display substrate. Examples of semiconductor junctions include, but are not limited to, a PN photodiode, a PIN photodiode, an avalanche photodiode, a MIM diode junction, a MIS diode junction, a MOS diode junction, a SIS diode junction, and a MS diode junction.

Optionally, each subpixel area of the plurality of subpixel areas Spa includes one of the plurality of light emitting brightness value detectors D. Optionally, not every subpixel area includes one of the plurality of light emitting brightness value detectors D, but only one out of several subpixel areas include one of the plurality of light emitting brightness value detectors D in one of the plurality of subpixel areas Spa.

Figure 3A:
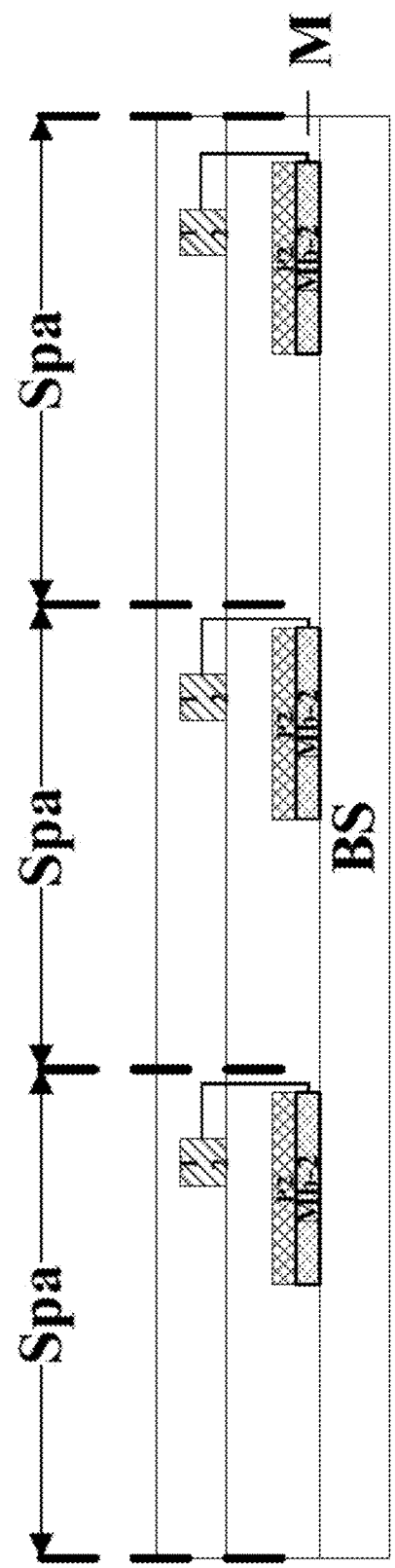
FIG. 3A is a schematic diagram illustrating the structure of a display substrate in some embodiments according to the present disclosure.
Figure 3B:
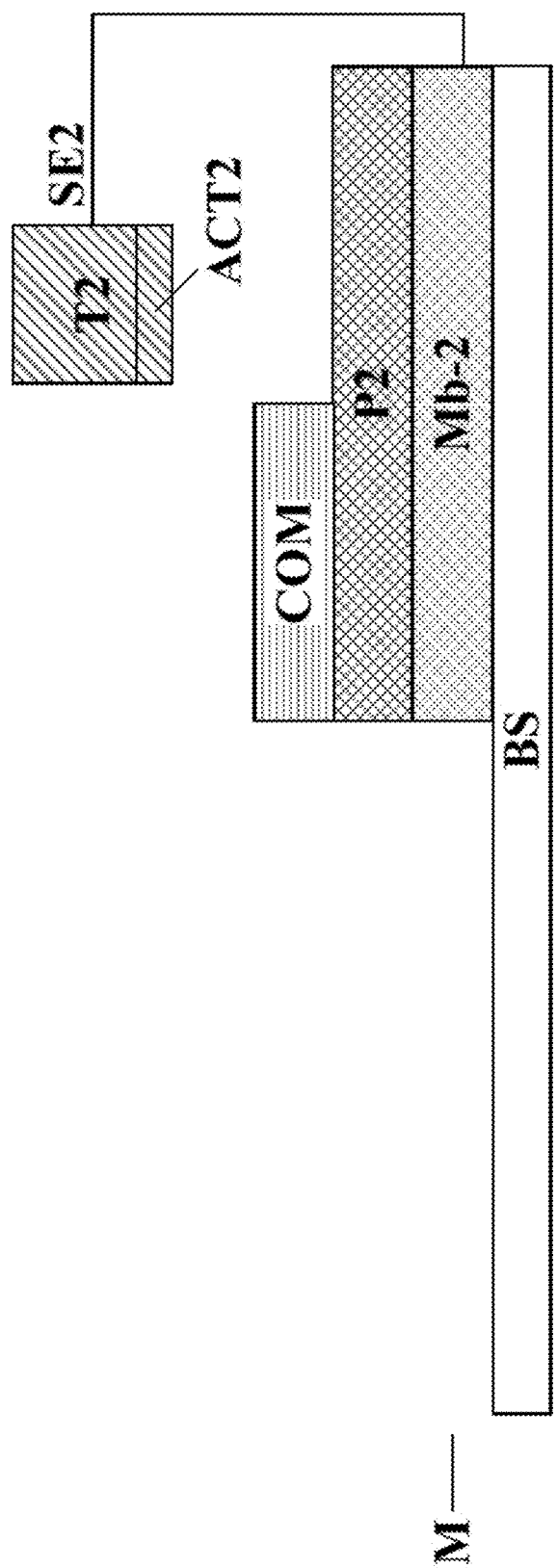
FIG. 3B is a zoom-in view of FIG. 3A.

FIG. 3A is a schematic diagram illustrating the structure of a display substrate in some embodiments according to the present disclosure. FIG. 3B is a zoom-in view of FIG. 3A. Referring to FIG. 3A and FIG. 3B, the display substrate includes a plurality of second semiconductor junctions P2 respectively configured to detect light emitting brightness values in a plurality of subpixel areas Spa of the display substrate, respectively. Optionally, orthographic projections of the plurality of second semiconductor junctions P2 on the base substrate BS respectively covers orthographic projections of the second active layers ACT2 of the plurality of second thin film transistors T2 on the base substrate BS. A non-overlapping region of each of the plurality of second semiconductor junctions P2 is used for detecting a light emitting brightness value in a respective one of the plurality of subpixel areas Spa.

The light shielding layer M includes a plurality of second light shielding blocks Mb-2. Orthographic projections of the plurality of second light shielding blocks Mb-2 on the base substrate BS respectively covers orthographic projections of the second active layers ACT2 of the plurality of second thin film transistors T2 on the base substrate BS. The plurality of second semiconductor junctions P2 and the plurality of second light shielding blocks Mb-2 are configured to cooperatively shield light from irradiating on the second active layers ACT2 of the plurality of second thin film transistors T2.

Referring to FIG. 3B, the plurality of second light shielding blocks Mb-2 are respectively electrically connected to source electrodes SE2 of the plurality of second thin film transistors T2, and are respectively electrically connected to the plurality of second semiconductor junctions P2. A first terminal of each of the plurality of second semiconductor junctions P2 is electrically connected to a common electrode configured to be provided with a common voltage Vcom. A second terminal of each of the plurality of second semiconductor junctions P2 is electrically connected to one of the plurality of second light shielding blocks Mb-2.

Figure 4A:
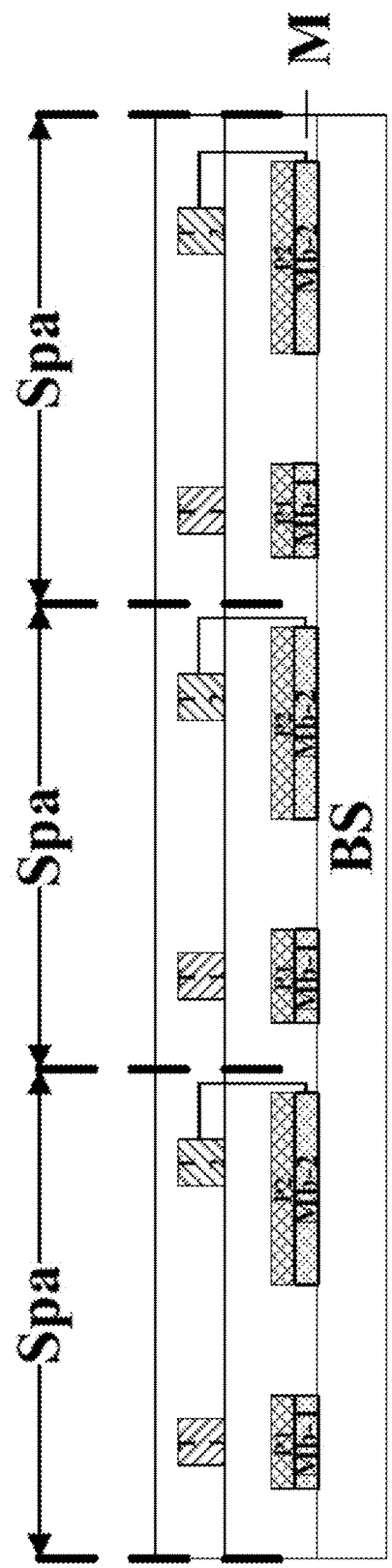
FIG. 4A is a schematic diagram illustrating the structure of a display substrate in some embodiments according to the present disclosure.
Figure 4B:
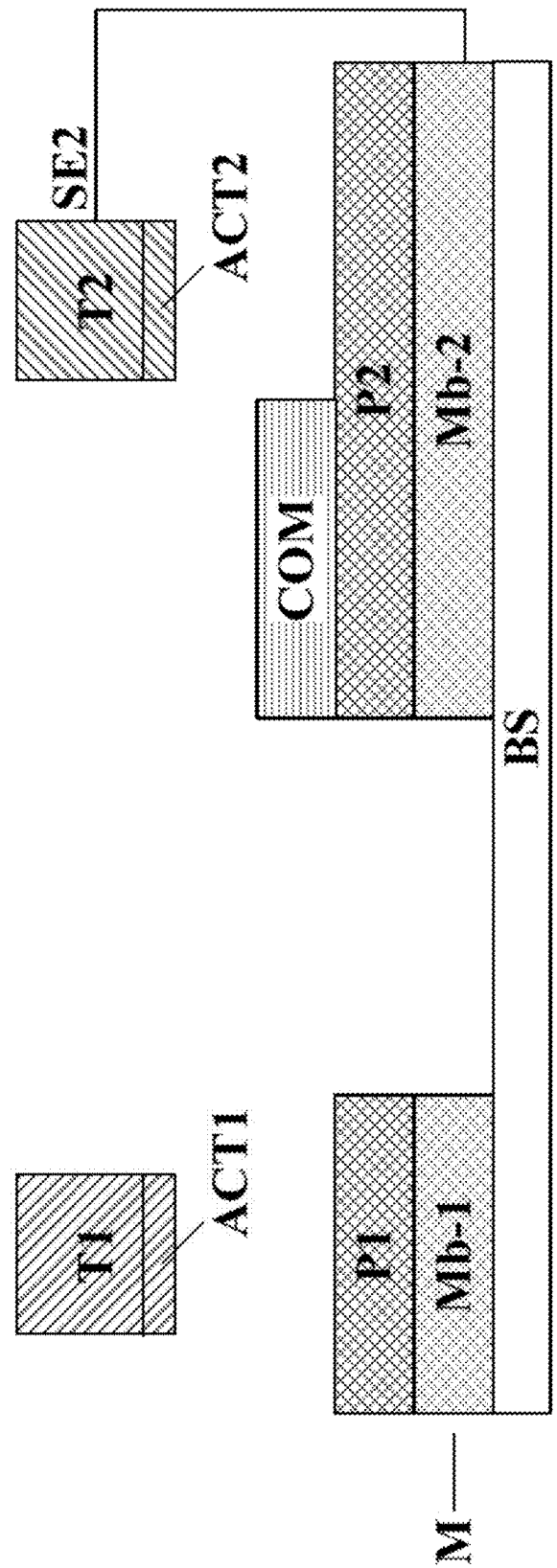
FIG. 4B is a zoom-in view of FIG. 4A.

FIG. 4A is a schematic diagram illustrating the structure of a display substrate in some embodiments according to the present disclosure. FIG. 4B is a zoom-in view of FIG. 4A. Referring to FIG. 4A and FIG. 4B, the plurality of semiconductor junctions include a plurality of first semiconductor junctions P1 respectively in the plurality of subpixel areas Spa, and a plurality of second semiconductor junctions P2 respectively configured to detect light emitting brightness values in a plurality of subpixel areas Spa of the display substrate, respectively. The plurality of thin film transistors in some embodiments includes an array of a plurality of first thin film transistors T1 on the base substrate BS and respectively in the plurality of subpixel areas Spa for driving light emission of the display substrate, and a plurality of second thin film transistors T2 respectively electrically connected to the plurality of second semiconductor junctions P2. As shown in FIG. 4A and FIG. 4B, orthographic projections of the plurality of first semiconductor junctions P1 on the base substrate BS respectively covers orthographic projections of the first active layers ACT1 of the plurality of first thin film transistors T1 on the base substrate BS; and orthographic projections of the plurality of second semiconductor junctions P2 on the base substrate BS respectively covers orthographic projections of the second active layers ACT2 of the plurality of second thin film transistors T2 on the base substrate BS. A non-overlapping region of each of the plurality of second semiconductor junctions P2 is used for detecting a light emitting brightness value in a respective one of the plurality of subpixel areas Spa. The plurality of first semiconductor junctions P1 are dummy semiconductor junctions, and the plurality of second semiconductor junctions P2 are active semiconductor junctions configured to detect light emitting brightness values in a plurality of subpixel areas Spa of the display substrate.

The light shielding layer M in some embodiments includes a plurality of first light shielding blocks Mb-1 respective in the plurality of subpixel areas Spa; and a plurality of second light shielding blocks Mb-2. Orthographic projections of the plurality of first light shielding blocks Mb-1 on the base substrate BS respectively covers orthographic projections of the first active layers ACT1 of the plurality of first thin film transistors T1 on the base substrate BS; and orthographic projections of the plurality of second light shielding blocks Mb-2 on the base substrate BS respectively covers orthographic projections of the second active layers ACT2 of the plurality of second thin film transistors T2 on the base substrate BS. The plurality of first semiconductor junctions P1 and the plurality of first light shielding blocks Mb-1 are configured to cooperatively shield light from irradiating on the first active layers ACT1 of the plurality of first thin film transistors T1, and the plurality of second semiconductor junctions P2 and the plurality of second light shielding blocks Mb-2 are configured to cooperatively shield light from irradiating on the second active layers ACT2 of the plurality of second thin film transistors T2.

Figure 8A:
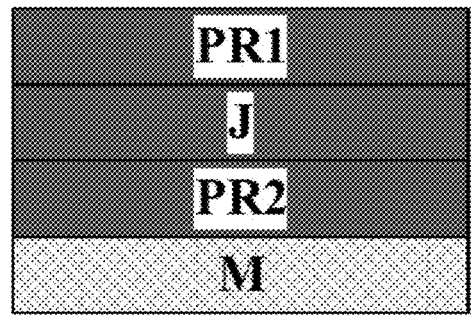
FIGS. 8A and 8B are schematic diagrams illustrating the structure of semiconductor junctions in some embodiments according to the present disclosure.
Figure 8B:
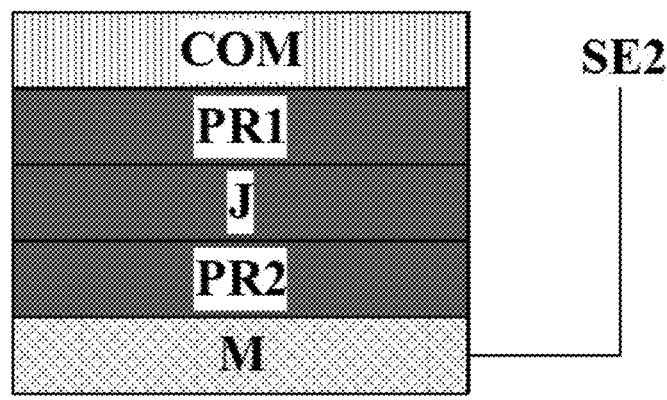

FIGS. 8A and 8B are schematic diagrams illustrating the structure of semiconductor junctions in some embodiments according to the present disclosure. FIG. 8A illustrate the structure of a dummy semiconductor junction in some embodiments according to the present disclosure, e.g., the plurality of first semiconductor junctions P1 in FIG. 4A and FIG. 4B. As shown in FIG. 8A, the dummy semiconductor junction in some embodiments includes a first polarity region PR1, and a second polarity region PR2 connected to the light shielding layer M, and a diode junction J connecting the first polarity region PR1 and the second polarity region PR2. The dummy semiconductor junction and the light shield layer M are configured to cooperatively shield light from irradiating on active layers of the plurality of thin film transistors.

FIG. 8B illustrate the structure of an active semiconductor junction in some embodiments according to the present disclosure, e.g., the plurality of second semiconductor junctions P2 in FIG. 4A and FIG. 4B. As shown in FIG. 8B, the active semiconductor junction in some embodiments includes a first polarity region PR1 connected to a common electrode COM, and a second polarity region PR2 connected to a source electrode SE2 of one of the plurality of second thin film transistors T2 through the light shielding layer M, and a diode junction J connecting the first polarity region PR1 and the second polarity region PR2. As used herein, the term diode junction refers to a junction that can exhibit current rectification. e.g., a junction that exhibits drastically different conductivities in one bias direction relative to the other.

Optionally, the semiconductor junction having a diode junction includes a first polarity region having a first dopant, a second polarity region having a second dopant, and a diode junction connecting the first polarity region and the second polarity region. Optionally, the semiconductor junction having a diode junction is reversely biased when the first polarity region is connected to a low voltage and the second polarity region is connected to a high voltage. For example, the semiconductor junction having a diode junction is in a reversely biased state when the first polarity region is connected to a common electrode (low voltage, e.g., −5 V to 0 V). In some embodiments, the semiconductor junction having a diode junction is a PN photodiode having a P+ doping semiconductor region as the first polarity region and an N+ doping semiconductor region as the second polarity region. In some embodiments, the semiconductor junction having a diode junction is a PIN photodiode having a P+ doping semiconductor region as the first polarity region, an N+ doping semiconductor region as the second polarity region, and an intrinsic region of amorphous silicon between the P+ doping semiconductor region and the N+ doping semiconductor region.

Figure 5A:
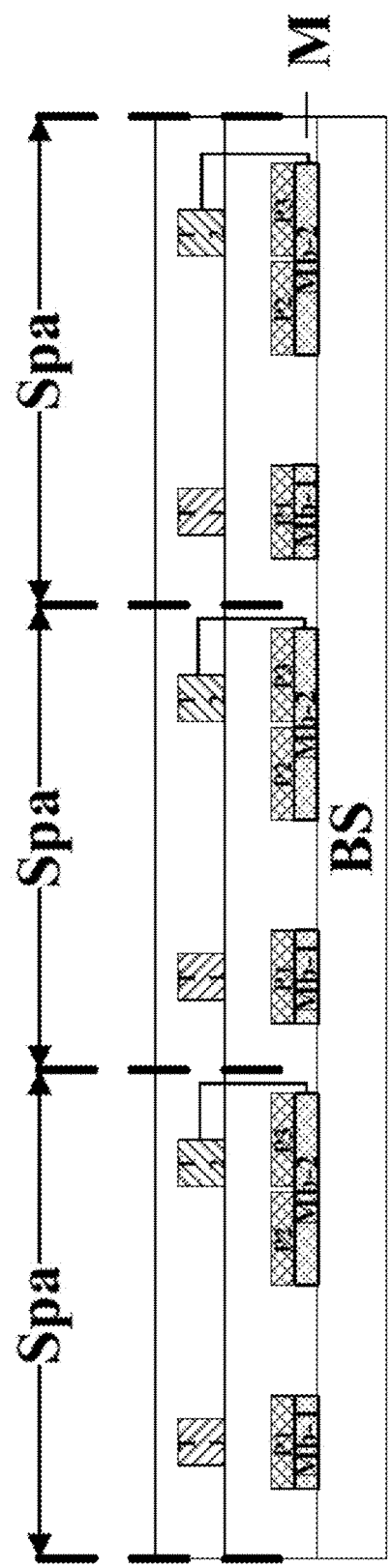
FIG. 5A is a schematic diagram illustrating the structure of a display substrate in some embodiments according to the present disclosure.
Figure 5B:
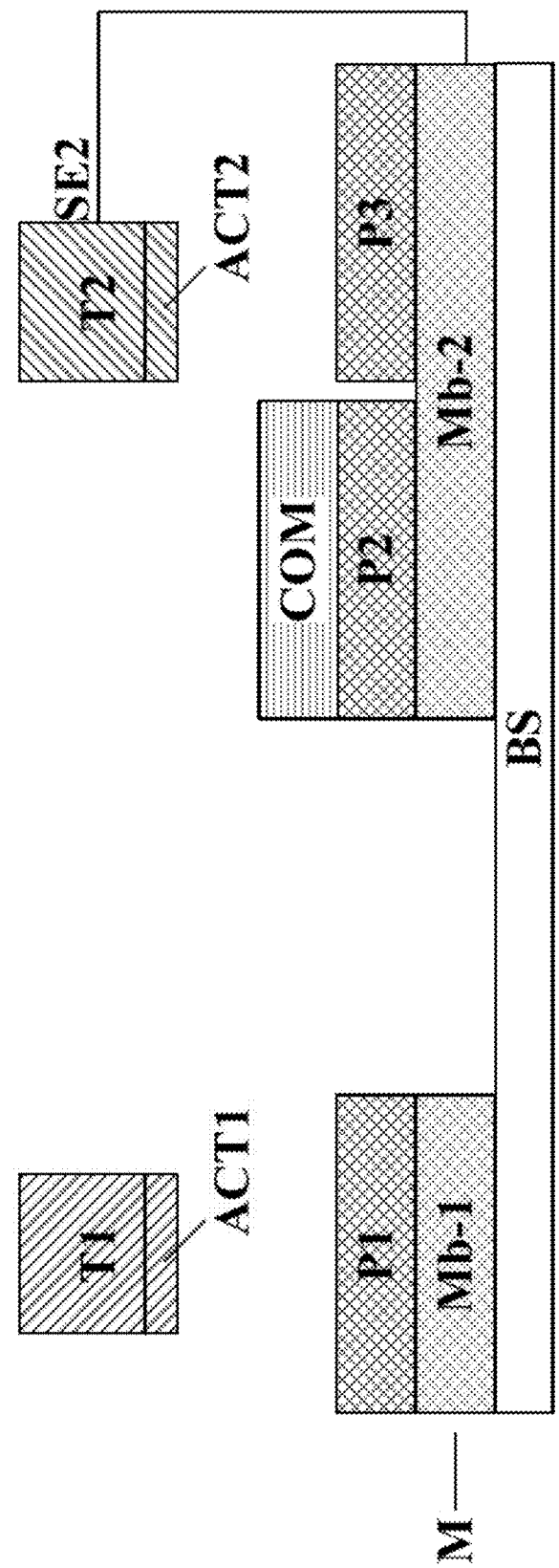
FIG. 5B is a zoom-in view of FIG. 5A.

In some embodiments, the plurality of semiconductor junctions further includes a plurality of third semiconductor junctions. FIG. 5A is a schematic diagram illustrating the structure of a display substrate in some embodiments according to the present disclosure. FIG. 5B is a zoom-in view of FIG. 5A. Referring to FIG. 5A and FIG. 5B, the plurality of semiconductor junctions include a plurality of first semiconductor junctions P1 respectively in the plurality of subpixel areas Spa; a plurality of second semiconductor junctions P2 respectively configured to detect light emitting brightness values in a plurality of subpixel areas Spa of the display substrate, respectively; and a plurality of third semiconductor junctions P3. The plurality of thin film transistors in some embodiments includes an array of a plurality of first thin film transistors T1 on the base substrate BS and respectively in the plurality of subpixel areas Spa for driving light emission of the display substrate, and a plurality of second thin film transistors T2 respectively electrically connected to the plurality of second semiconductor junctions P2. As shown in FIG. 5A and FIG. 5B, orthographic projections of the plurality of first semiconductor junctions P1 on the base substrate BS respectively covers orthographic projections of the first active layers ACT1 of the plurality of first thin film transistors T1 on the base substrate BS; and orthographic projections of the plurality of third semiconductor junctions P3 on the base substrate BS respectively covers orthographic projections of the second active layers ACT2 of the plurality of second thin film transistors T2 on the base substrate BS. Optionally, orthographic projections of second semiconductor junctions P2 on the base substrate BS are substantially non-overlapping with the orthographic projections of the second active layers ACT2 of the plurality of second thin film transistors T2 on the base substrate BS. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping. Each of the plurality of second semiconductor junctions P2 is used for detecting a light emitting brightness value in a respective one of the plurality of subpixel areas Spa. The plurality of first semiconductor junctions P1 and the plurality of third semiconductor junctions P3 are dummy semiconductor junctions, and the plurality of second semiconductor junctions P2 are active semiconductor junctions configured to detect light emitting brightness values in a plurality of subpixel areas Spa of the display substrate.

The light shielding layer M in some embodiments includes a plurality of first light shielding blocks Mb-1 respective in the plurality of subpixel areas Spa; and a plurality of second light shielding blocks Mb-2. Orthographic projections of the plurality of first light shielding blocks Mb-1 on the base substrate BS respectively covers orthographic projections of the first active layers ACT1 of the plurality of first thin film transistors T1 on the base substrate BS; and orthographic projections of the plurality of second light shielding blocks Mb-2 on the base substrate BS respectively covers orthographic projections of the second active layers ACT2 of the plurality of second thin film transistors T2 on the base substrate BS. The plurality of first semiconductor junctions P1 and the plurality of first light shielding blocks Mb-1 are configured to cooperatively shield light from irradiating on the first active layers ACT1 of the plurality of first thin film transistors T1, and the plurality of third semiconductor junctions P3 and the plurality of second light shielding blocks Mb-2 are configured to cooperatively shield light from irradiating on the second active layers ACT2 of the plurality of second thin film transistors T2. Moreover, the orthographic projections of the plurality of second light shielding blocks Mb-2 on the base substrate BS at least partially respectively overlap with orthographic projections of the plurality of second semiconductor junctions P2 on the base substrate BS. As shown in FIG. 5A and FIG. 5B, the plurality of second semiconductor junctions P2 are respectively adjacent to the plurality of third semiconductor junctions P3, each individual one of the plurality of second semiconductor junctions P2 is spaced apart and insulated from a respective one of the plurality of third semiconductor junctions P3. The plurality of third semiconductor junctions P3 are dummy semiconductor junctions, and the plurality of second semiconductor junctions P2 are active semiconductor junctions respectively configured to detect light emitting brightness values in a plurality of subpixel areas Spa of the display substrate, respectively. The plurality of second light shielding blocks Mb-2 are respectively electrically connected to source electrodes SE2 of the plurality of second thin film transistors 12, and are respectively electrically connected to the plurality of second semiconductor junctions P2 (e.g., through a second polarity region). In the example as shown in FIG. 5A and FIG. 5B, each of the plurality of second light shielding blocks Mb-2 is electrically connected to a respective one of the plurality of second semiconductor junctions P2 and a respective one of the plurality of third semiconductor junctions P3. Optionally, an orthographic projection of each of the plurality of second light shielding blocks Mb-2 on the base substrate BS covers orthographic projections of the respective one of the plurality of second semiconductor junctions P2 and the respective one of the plurality of third semiconductor junctions P3 on the base substrate BS.

Figure 6A:
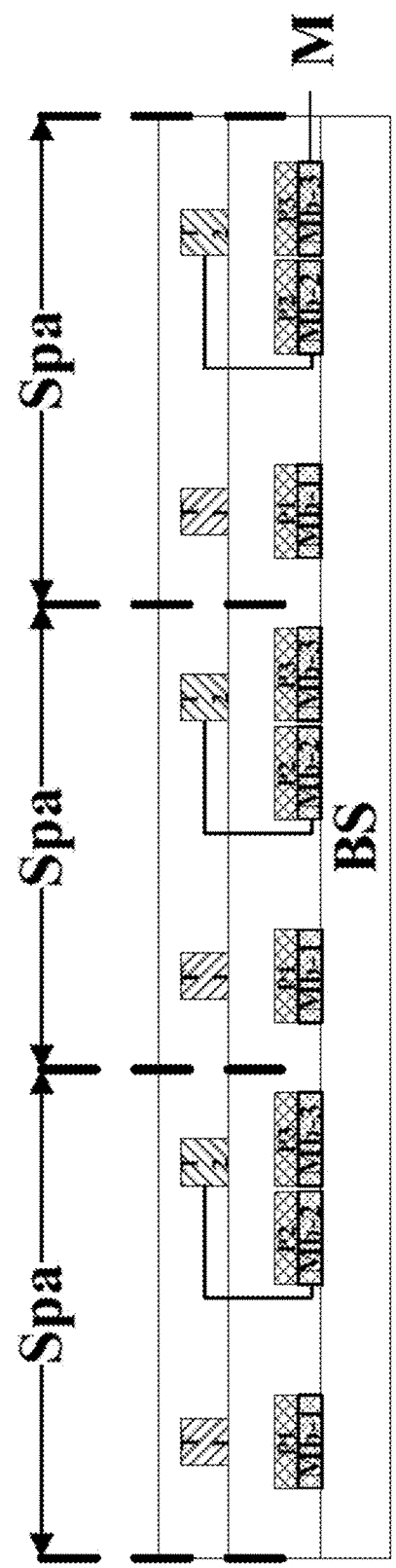
FIG. 6A is a schematic diagram illustrating the structure of a display substrate in some embodiments according to the present disclosure.
Figure 6B:
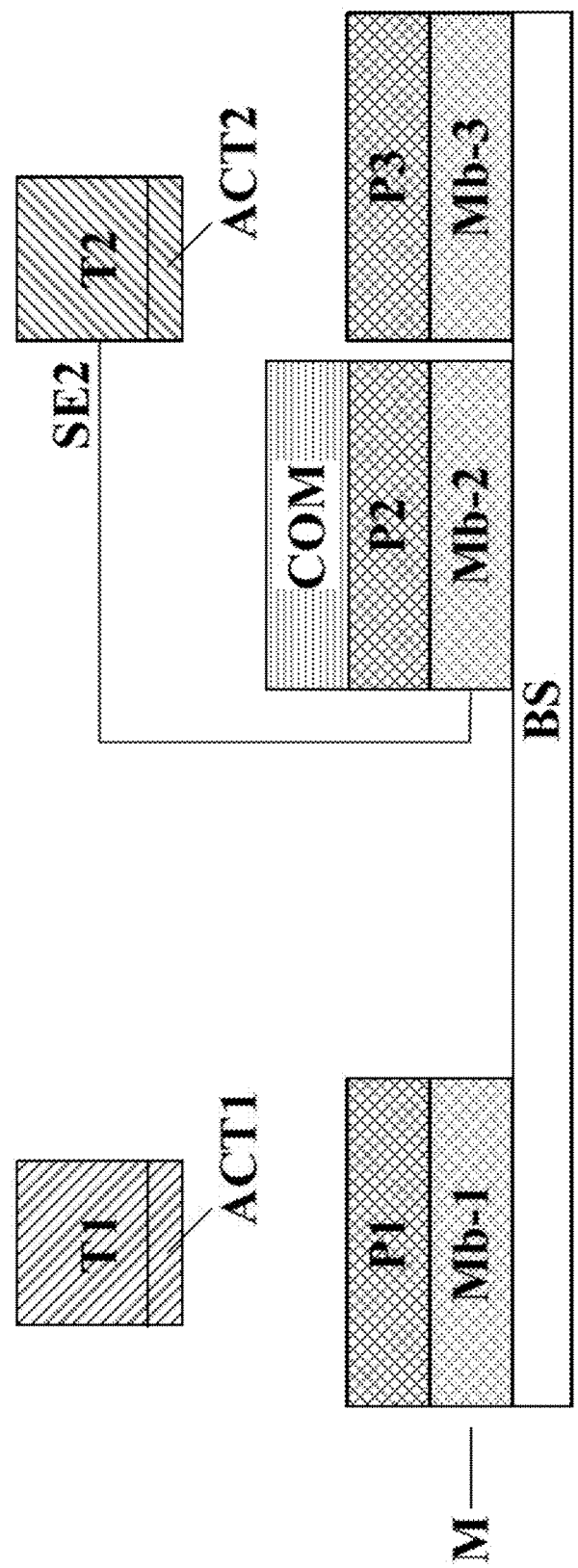
FIG. 6B is a zoom-in view of FIG. 6A.

In some embodiments, the light shielding layer further includes a plurality of third light shielding blocks corresponding to the plurality of third semiconductor junctions P3. FIG. 6A is a schematic diagram illustrating the structure of a display substrate in some embodiments according to the present disclosure. FIG. 6B is a zoom-in view of FIG. 6A. Referring to FIG. 6A and FIG. 6B, the plurality of semiconductor junctions include a plurality of first semiconductor junctions P1 respectively in the plurality of subpixel areas Spa; a plurality of second semiconductor junctions P2 respectively configured to detect light emitting brightness values in a plurality of subpixel areas Spa of the display substrate, respectively; and a plurality of third semiconductor junctions P3. The plurality of thin film transistors in some embodiments includes an array of a plurality of first thin film transistors T1 on the base substrate BS and respectively in the plurality of subpixel areas Spa for driving light emission of the display substrate, and a plurality of second thin film transistors T2 respectively electrically connected to a plurality of second semiconductor junctions P2. As shown in FIG. 6A and FIG. 6B, orthographic projections of the plurality of first semiconductor junctions P1 on the base substrate BS respectively covers orthographic projections of the first active layers ACT1 of the plurality of first thin film transistors T1 on the base substrate BS; and orthographic projections of the plurality of third semiconductor junctions P3 on the base substrate BS respectively covers orthographic projections of the second active layers ACT2 of the plurality of second thin film transistors T2 on the base substrate BS. Optionally, orthographic projections of the plurality of second semiconductor junctions P2 on the base substrate BS are substantially non-overlapping with the orthographic projections of the second active layers ACT2 of the plurality of second thin film transistors T2 on the base substrate BS. Each of the plurality of second semiconductor junctions P2 is used for detecting a light emitting brightness value in a respective one of the plurality of subpixel areas Spa. The plurality of first semiconductor junctions P1 and the plurality of third semiconductor junctions P3 are dummy semiconductor junctions, and the plurality of second semiconductor junctions P2 are active semiconductor junctions configured to detect light emitting brightness values in a plurality of subpixel areas Spa of the display substrate.

The light shielding layer M in some embodiments includes a plurality of first light shielding blocks Mb-1 respective in the plurality of subpixel areas Spa; a plurality of second light shielding blocks Mb-2; and a plurality of third light shielding blocks Mb-3. Orthographic projections of the plurality of first light shielding blocks Mb-1 on the base substrate BS respectively covers orthographic projections of the first active layers ACT1 of the plurality of first thin film transistors T1 on the base substrate BS; and orthographic projections of the plurality of third light shielding blocks Mb-3 on the base substrate BS respectively covers orthographic projections of the second active layers ACT2 of the plurality of second thin film transistors T2 on the base substrate BS. Optionally, orthographic projections of the plurality of second light shielding blocks Mb-2 on the base substrate BS are substantially non-overlapping with the orthographic projections of the second active layers ACT2 of the plurality of second thin film transistors T2 on the base substrate BS, and are substantially non-overlapping with the orthographic projections of the first active layers ACT1 of the plurality of first thin film transistors T1 on the base substrate BS. The plurality of first semiconductor junctions P1 and the plurality of first light shielding blocks Mb-1 are configured to cooperatively shield light from irradiating on the first active layers ACT1 of the plurality of first thin film transistors T1, and the plurality of third semiconductor junctions P3 and the plurality of third light shielding blocks Mb-3 are configured to cooperatively shield light from irradiating on the second active layers ACT2 of the plurality of second thin film transistors T2. Optionally, orthographic projections of the plurality of second light shielding blocks Mb-2 on the base substrate BS at least partially respectively overlap with orthographic projections of the plurality of second semiconductor junctions P2 on the base substrate BS. As shown in FIG. 6A and FIG. 6B, the plurality of second semiconductor junctions P2 are respectively adjacent to the plurality of third semiconductor junctions P3, each individual one of the plurality of second semiconductor junctions P2 is spaced apart and insulated from a respective one of the plurality of third semiconductor junctions P3. The plurality of second light shielding blocks Mb-2 are respectively adjacent to the plurality of third light shielding blocks Mb-3, each individual one of the plurality of second light shielding blocks Mb-2 is spaced apart and insulated from a respective one of the plurality of third light shielding blocks Mb-3.

The plurality of third semiconductor junctions P3 are dummy semiconductor junctions, and the plurality of second semiconductor junctions P2 are active semiconductor junctions respectively configured to detect light emitting brightness values in a plurality of subpixel areas Spa of the display substrate, respectively. The plurality of second light shielding blocks Mb-2 are respectively electrically connected to source electrodes SE2 of the plurality of second thin film transistors T2, and are respectively electrically connected to the plurality of second semiconductor junctions P2 (e.g., through a second polarity region). Each of the plurality of second light shielding blocks Mb-2 is electrically connected to a respective one of the plurality of second semiconductor junctions P2. Each of the plurality of third light shielding blocks Mb-3 is electrically connected to and a respective one of the plurality of third semiconductor junctions P3. Each individual one of the plurality of second semiconductor junctions P2 is spaced apart and insulated from a respective one of the plurality of third semiconductor junctions P3. Each individual one of the plurality of second light shielding blocks Mb-2 is spaced apart and insulated from a respective one of the plurality of third light shielding blocks Mb-3. Optionally, an orthographic projection of each of the plurality of second light shielding blocks Mb-2 on the base substrate BS covers an orthographic projection of a respective one of the plurality of second semiconductor junctions P2 on the base substrate BS, and an orthographic projection of each of the plurality of third light shielding blocks Mb-3 on the base substrate BS covers a respective one of the plurality of third semiconductor junctions P3 on the base substrate BS.

Figure 9A:
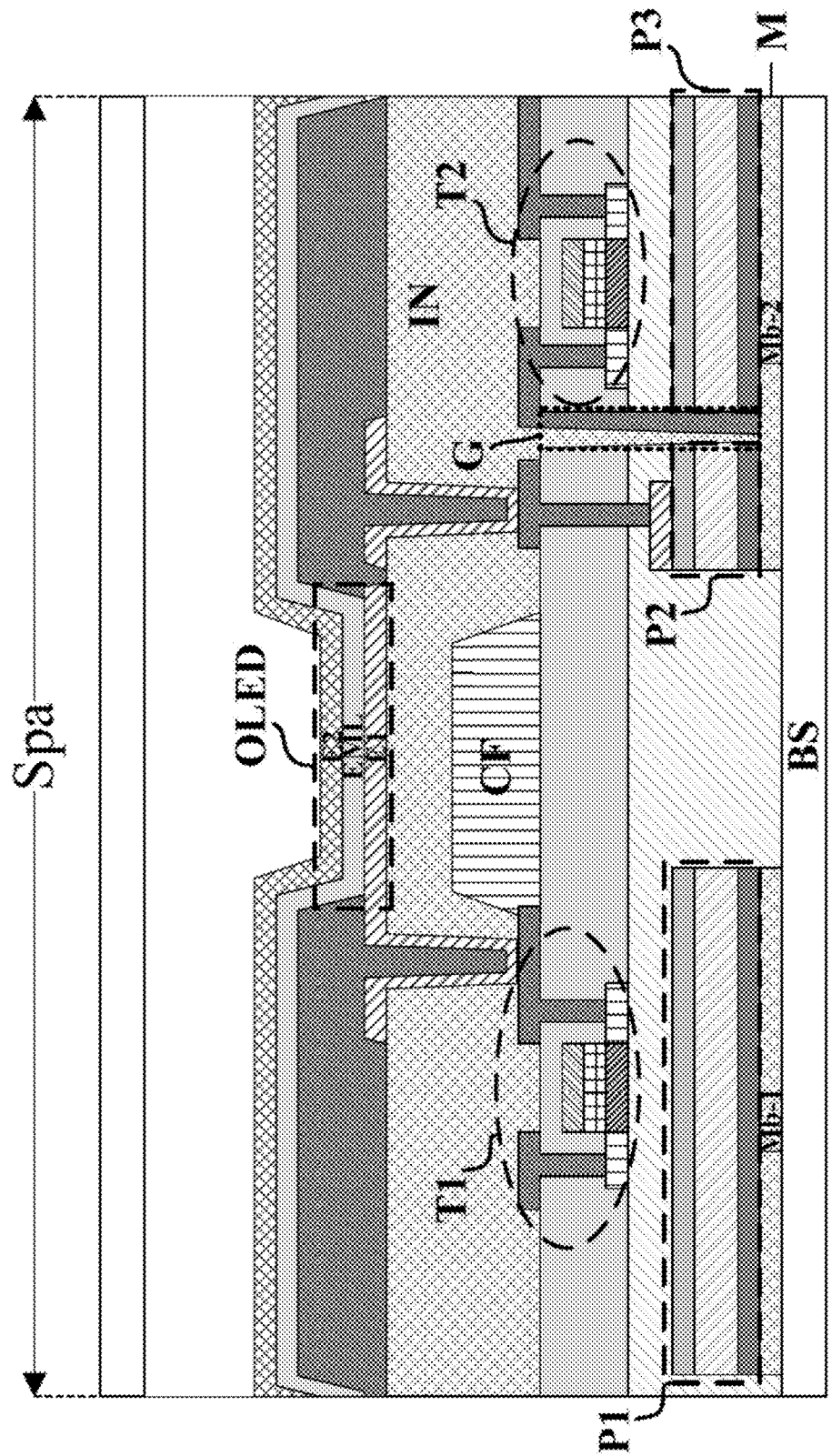
FIG. 9A is a schematic diagram illustrating the structure of a display substrate in some embodiments according to the present disclosure.
Figure 9B:
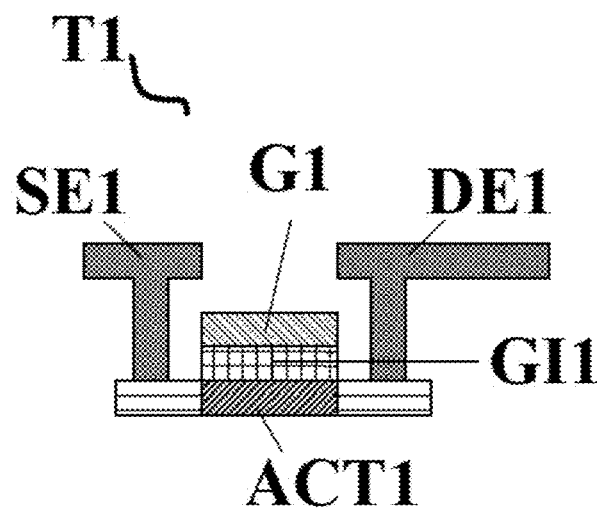
FIG. 9B is a schematic diagram illustrating the structure of one of a plurality of first thin film transistors in some embodiments according to the present disclosure.
Figure 9C:
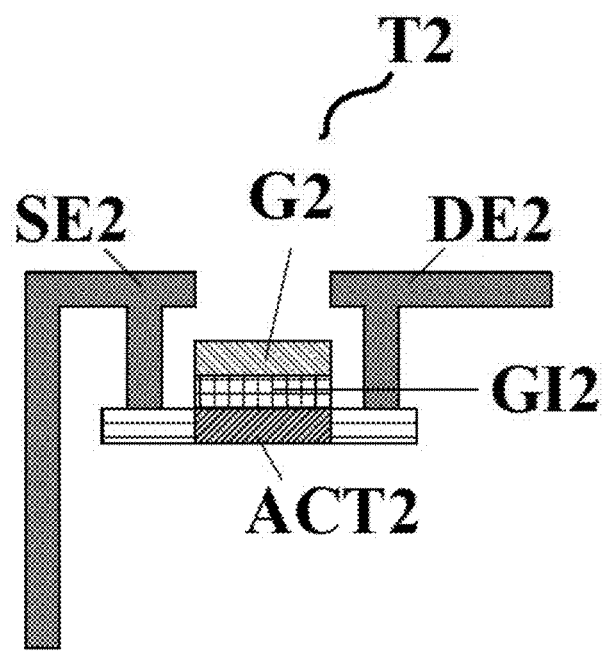
FIG. 9C is a schematic diagram illustrating the structure of one of a plurality of second thin film transistors in some embodiments according to the present disclosure.

FIG. 9A is a schematic diagram illustrating the structure of a display substrate in some embodiments according to the present disclosure. FIG. 9B is a schematic diagram illustrating the structure of one of a plurality of first thin film transistors in some embodiments according to the present disclosure. FIG. 9C is a schematic diagram illustrating the structure of one of a plurality of second thin film transistors in some embodiments according to the present disclosure. The display substrate in FIG. 9A has a structure similar to that illustrated in FIG. 5A and FIG. 5B. Specifically, FIG. 9A shows the structure of the display substrate in one subpixel. The display substrate includes a base substrate BS; a plurality of thin film transistors on the base substrate BS; a light shielding layer M; and a plurality of semiconductor junctions. The light shielding layer M and the plurality of semiconductor junctions are configured to cooperatively shield light from irradiating on active layers of the plurality of thin film transistors. The plurality of semiconductor junctions include a plurality of first semiconductor junctions P1 respectively in the plurality of subpixel areas Spa; a plurality of second semiconductor junctions P2 respectively configured to detect light emitting brightness values in a plurality of subpixel areas Spa of the display substrate, respectively; and a plurality of third semiconductor junctions P3. The plurality of thin film transistors includes an array of a plurality of first thin film transistors T1 on the base substrate BS and respectively in the plurality of subpixel areas Spa for driving light emission of the display substrate, and a plurality of second thin film transistors T2 respectively electrically connected to the plurality of second semiconductor junctions P2. The light shielding layer M includes a plurality of first light shielding blocks Mb-1 respective in the plurality of subpixel areas Spa; and a plurality of second light shielding blocks Mb-2. The plurality of first semiconductor junctions P1 and the plurality of first light shielding blocks Mb-1 are configured to cooperatively shield light from irradiating on the first active layers ACT1 of the plurality of first thin film transistors T1, and the plurality of third semiconductor junctions P3 and the plurality of second light shielding blocks Mb-2 are configured to cooperatively shield light from irradiating on the second active layers ACT2 of the plurality of second thin film transistors T2. The orthographic projections of the plurality of second light shielding blocks Mb-2 on the base substrate BS at least partially respectively overlap with orthographic projections of the plurality of second semiconductor junctions P2 on the base substrate BS. The plurality of second light shielding blocks Mb-2 are respectively electrically connected to source electrodes SE2 of the plurality of second thin film transistors T2, and are respectively electrically connected to the plurality of second semiconductor junctions P2 (e.g., through a second polarity region). Each of the plurality of second light shielding blocks Mb-2 is electrically connected to a respective one of the plurality of second semiconductor junctions P2 and a respective one of the plurality of third semiconductor junctions P3. The plurality of second semiconductor junctions P2 are respectively adjacent to the plurality of third semiconductor junctions P3, each individual one of the plurality of second semiconductor junctions P2 is spaced apart and insulated from a respective one of the plurality of third semiconductor junctions P3.

Referring to FIG. 9A, in some embodiments, each individual one of the plurality of second semiconductor junctions P2 is spaced apart and insulated from a respective one of the plurality of third semiconductor junctions P3 by a groove G. The display substrate further includes an insulating layer IN extending into the groove G, thereby insulating each individual one of the plurality of second semiconductor junctions P2 from the respective one of the plurality of third semiconductor junctions P3. Referring to FIG. 9A and FIG. 9C, a source electrode SE2 of each individual one of the plurality of second thin film transistor T2 is electrically connected to a respective one of the plurality of second light shielding blocks Mb-2 through the groove G. The insulating layer IN insulates the source electrode SE2 from a respective one of the plurality of second semiconductor junctions P2. The plurality of second light shielding blocks Mb-2 are respectively electrically connected to source electrodes SE2 of the plurality of second thin film transistors T2, and a respectively electrically connected to the plurality of second semiconductor junctions P2. Optionally, an orthographic projection of the source electrode SE2 of each individual one of the plurality of second thin film transistors T2 on the base substrate BS is substantially non-overlapping with an orthographic projection of the respective one of the plurality of second semiconductor junctions P2 on the base substrate BS.

Referring to FIG. 9A, in some embodiments, the display substrate further includes a color filter CF, for example, the display substrate is a color-on-array display substrate. Optionally, an orthographic projection of the color filter CF on the base substrate BS is substantially non-overlapping with orthographic projections of the plurality of second semiconductor junctions P2 on the base substrate BS. By having this design, the light sensed by the plurality of second semiconductor junctions P2 is unfiltered. The plurality of second semiconductor junctions P2 can directly detect light emitting brightness values of an unfiltered light emitted from a light emitting element in a plurality of subpixel areas Spa of the display substrate, respectively.

Figure 10:
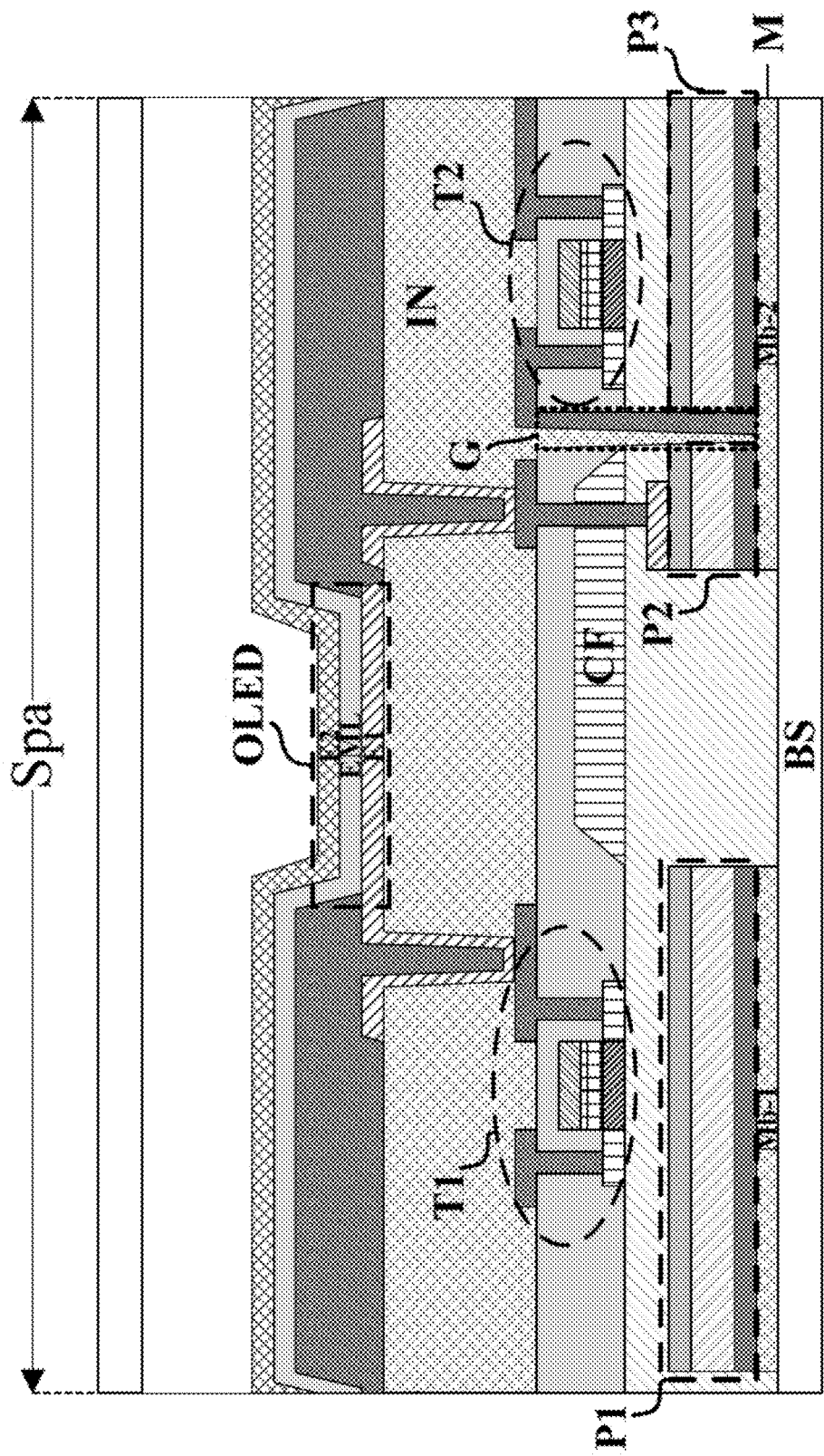
FIG. 10 is a schematic diagram illustrating the structure of a display substrate in some embodiments according to the present disclosure.

FIG. 10 is a schematic diagram illustrating the structure of a display substrate in some embodiments according to the present disclosure. Referring to FIG. 10, an orthographic projection of the color filter CF on the base substrate BS at least partially overlapping with (e.g., substantially covers) orthographic projections of the plurality of second semiconductor junctions P2 on the base substrate BS. As used herein, the term "substantially covers" refers to one orthographic projection being at least 50%, at least 60%, at least 70%, at least 80%, at least 90%, at least 95%, at least 99%, or 100% covered by another orthographic projection. By having this design, the light sensed by the plurality of second semiconductor junctions P2 is a light filtered by the color filter CF. The plurality of second semiconductor junctions P2 can detect light emitting brightness values in a plurality of subpixel areas Spa of the display substrate, respectively.

Referring to FIG. 9A and FIG. 10, in some embodiments, the display substrate is an organic light emitting diode display substrate having a plurality of organic light emitting diodes OLED. Optionally, the plurality of light emitting brightness value detectors are configured to detect light emitting brightness values of the plurality of organic light emitting diodes OLED respectively. Each of the plurality of organic light emitting diodes OLED includes a first electrode E1 (e.g., an anode), a light emitting layer EML on the first electrode E1, and a second electrode (e.g., a cathode) on a side of the light emitting layer EML distal to the first electrode E1.

Optionally, the display substrate is a quantum dots light emitting diode display substrate having a plurality of quantum dots light emitting diodes. Optionally, the plurality of light emitting brightness value detectors are configured to detect light emitting brightness values of the plurality of quantum dots light emitting diodes respectively.

Optionally, the display substrate is a micro light emitting diode display substrate having a plurality of micro light emitting diodes. Optionally, the plurality of light emitting brightness value detectors are configured to detect light emitting brightness values of the plurality of micro light emitting diodes respectively.

Optionally, the display substrate is a liquid crystal display substrate. Optionally, the plurality of light emitting brightness value detectors are configured to detect light emitting brightness values of a plurality of subpixels in the liquid crystal display substrate respectively.

Optionally, the display substrate is a top-emission type display substrate, e.g., a top-emission type organic light emitting diode display substrate. Optionally, the display substrate is a bottom-emission type display substrate, e.g., a bottom-emission type organic light emitting diode display substrate. Optionally, the display substrate is a dual-emission type display substrate, e.g., a dual-emission type organic light emitting diode display substrate.

In some embodiments, and referring to FIG. 7 and FIG. 9A, the display substrate further includes a plurality of read lines R for respectively transmitting signals detected by the plurality of light emitting brightness value detectors D; and a compensation circuit C connected to the plurality of read lines R, and configured to adjust in real time the light emitting brightness values of the plurality of subpixel areas Spa to target brightness values.

In another aspect, the present disclosure provides a method of fabricating a display substrate having a plurality of subpixel areas. In some embodiments, the method includes forming a plurality of thin film transistors on a base substrate; forming a light shielding layer; and forming a plurality of semiconductor junctions. Optionally, the light shielding layer and the plurality of semiconductor junctions are formed to cooperatively shield light from irradiating on active layers of the plurality of thin film transistors. Optionally, the light shielding layer and the plurality of thin film transistors are formed so that an orthographic projection of the light shielding layer on the base substrate covers orthographic projections of the active layers of the plurality of thin film transistors on the base substrate. Optionally, the plurality of semiconductor junctions and the plurality of thin film transistors are formed so that orthographic projections of at least some of the plurality of semiconductor junctions on the base substrate respectively cover orthographic projections of the active layers of the plurality of thin film transistors on the base substrate. Optionally, at least some of the plurality of semiconductor junctions are formed as dummy semiconductor junctions.

In some embodiments, forming the plurality of thin film transistors includes forming an array of a plurality of first thin film transistors on the base substrate and respectively in the plurality of subpixel areas for driving light emission of the display substrate; and forming the plurality of semiconductor junctions includes forming a plurality of first semiconductor junctions respectively in the plurality of subpixel areas. The plurality of first semiconductor junctions and the plurality of first thin film transistors are formed so that orthographic projections of the plurality of first semiconductor junctions on the base substrate respectively covers orthographic projections of the first active layers of the plurality of first thin film transistors on the base substrate. The plurality of first semiconductor junctions are formed as dummy semiconductor junctions.

Optionally, forming the light shielding layer includes forming a plurality of first light shielding blocks respective in the plurality of subpixel areas. The plurality of first light shielding blocks and the plurality of first thin film transistors are formed so that orthographic projections of the plurality of first light shielding blocks on the base substrate respectively covers orthographic projections of the first active layers of the plurality of first thin film transistors on the base substrate. The plurality of first semiconductor junctions and the plurality of first light shielding blocks are formed to cooperatively shield light from irradiating on the first active layers of the plurality of first thin film transistors.

In some embodiments, the method further includes forming a plurality of light emitting brightness value detectors. Specifically, in some embodiments, forming the plurality of light emitting brightness value detectors includes forming a plurality of second semiconductor junctions and forming a plurality of second thin film transistors respectively electrically connected to the plurality of second semiconductor junctions. Optionally, the plurality of second semiconductor junctions are respectively formed to detect light emitting brightness values in a plurality of subpixel areas of the display substrate, respectively. Optionally, the plurality of second semiconductor junctions and the plurality of second thin film transistors are formed so that orthographic projections of the plurality of second semiconductor junctions on the base substrate respectively covers orthographic projections of the second active layers of the plurality of second thin film transistors on the base substrate; and forming the light shielding layer includes forming a plurality of second light shielding blocks. Optionally, the plurality of second light shielding blocks and the plurality of second thin film transistors are formed so that orthographic projections of the plurality of second light shielding blocks on the base substrate respectively covers orthographic projections of the second active layers of the plurality of second thin film transistors on the base substrate. The plurality of second semiconductor junctions and the plurality of second light shielding blocks are formed to cooperatively shield light from irradiating on the second active layers of the plurality of second thin film transistors. Optionally, the plurality of second light shielding blocks are formed to be respectively electrically connected to source electrodes of the plurality of second thin film transistors, and are formed to be respectively electrically connected to the plurality of second semiconductor junctions.

In some embodiments, forming the plurality of semiconductor junctions further includes forming a plurality of third semiconductor junctions. Optionally, the plurality of third semiconductor junctions and the plurality of second thin film transistors are formed so that orthographic projections of the plurality of third semiconductor junctions on the base substrate respectively covers orthographic projections of the second active layers of the plurality of second thin film transistors on the base substrate. Optionally, the plurality of third semiconductor junctions are formed as dummy semiconductor junctions. Optionally, forming the light shielding layer includes forming a plurality of third light shielding blocks. Optionally, the plurality of third light shielding blocks and the plurality of second thin film transistors are formed so that orthographic projections of the plurality of third light shielding blocks on the base substrate respectively covers orthographic projections of the second active layers of the plurality of second thin film transistors on the base substrate. The plurality of third semiconductor junctions and the plurality of third light shielding blocks are formed to cooperatively shield light from irradiating on the second active layers of the plurality of second thin film transistors.

In some embodiments, forming the plurality of semiconductor junctions further includes forming a plurality of third semiconductor junctions. Optionally, the plurality of third semiconductor junctions and the plurality of second thin film transistors are formed so that orthographic projections of the plurality of third semiconductor junctions on the base substrate respectively covers orthographic projections of the second active layers of the plurality of second thin film transistors on the base substrate. Optionally, forming the light shielding layer includes forming a plurality of second light shielding blocks. Optionally, the plurality of second light shielding blocks and the plurality of second thin film transistors are formed so that orthographic projections of the plurality of second light shielding blocks on the base substrate respectively covers orthographic projections of the second active layers of the plurality of second thin film transistors on the base substrate. Optionally, the plurality of second light shielding blocks and the plurality of second semiconductor junctions are formed so that the orthographic projections of the plurality of second light shielding blocks on the base substrate at least partially respectively overlap with orthographic projections of the plurality of second semiconductor junctions on the base substrate. The plurality of third semiconductor junctions and the plurality of second light shielding blocks are formed to cooperatively shield light from irradiating on the second active layers of the plurality of second thin film transistors. Optionally, the plurality of second light shielding blocks are formed to be respectively electrically connected to source electrodes of the plurality of second thin film transistors, and are formed to be respectively electrically connected to the plurality of second semiconductor junctions. Optionally, the plurality of third semiconductor junctions are formed as dummy semiconductor junctions.

In some embodiments, the plurality of second semiconductor junctions are formed respectively adjacent to the plurality of third semiconductor junctions, and each individual one of the plurality of second semiconductor junctions is formed to be spaced apart and insulated from a respective one of the plurality of third semiconductor junctions. Optionally, each individual one of the plurality of second semiconductor junctions is formed to be spaced apart from the respective one of the plurality of third semiconductor junctions by a groove. Optionally, the method further includes forming an insulating layer extending into the groove, thereby insulating each individual one of the plurality of second semiconductor junctions from the respective one of the plurality of third semiconductor junctions. Optionally, a source electrode of each individual one of the plurality of second thin film transistor is formed to be electrically connected to a respective one of the plurality of second light shielding blocks through the groove. Optionally, the insulating layer is formed to insulate the source electrode from a respective one of the plurality of second semiconductor junctions. Optionally, the plurality of second light shielding blocks are formed to be respectively electrically connected to source electrodes of the plurality of second thin film transistors, and are formed to be respectively electrically connected to the plurality of second semiconductor junctions. Optionally, an orthographic projection of the source electrode of each individual one of the plurality of second thin film transistors on the base substrate is substantially non-overlapping with an orthographic projection of the respective one of the plurality of second semiconductor junctions on the base substrate.

In some embodiments, the method further includes forming a color filter. Optionally, the color filter is formed so that an orthographic projection of the color filter on the base substrate is substantially non-overlapping with orthographic projections of the plurality of second semiconductor junctions on the base substrate. Optionally, the color filter is formed so that the orthographic projection of the color filter on the base substrate at least partially covers (e.g., substantially covers) the orthographic projections of the plurality of second semiconductor junctions on the base substrate.

In some embodiments, the method further includes forming a plurality of read lines for respectively transmitting signals detected by the plurality of light emitting brightness value detectors; and forming a compensation circuit connected to the plurality of read lines, and configured to adjust in real time the light emitting brightness values of the plurality of subpixel areas to target brightness values.

In some embodiments, the method further includes forming a common electrode configured to be provided with a common voltage signal. Optionally, each of the plurality of second semiconductor junctions is formed to include a first polarity region connected to the common electrode, a second polarity region connected to a source electrode of a respective one of the plurality of second thin film transistors, and a diode junction connecting the first polarity region and the second polarity region. Optionally, each of the plurality of second thin film transistors is formed to include a gate electrode, a source electrode connected to a second polarity region of a respective one of the plurality of second semiconductor junctions, and a drain electrode connected to a respective one of the plurality of read lines.

Figure 11A:
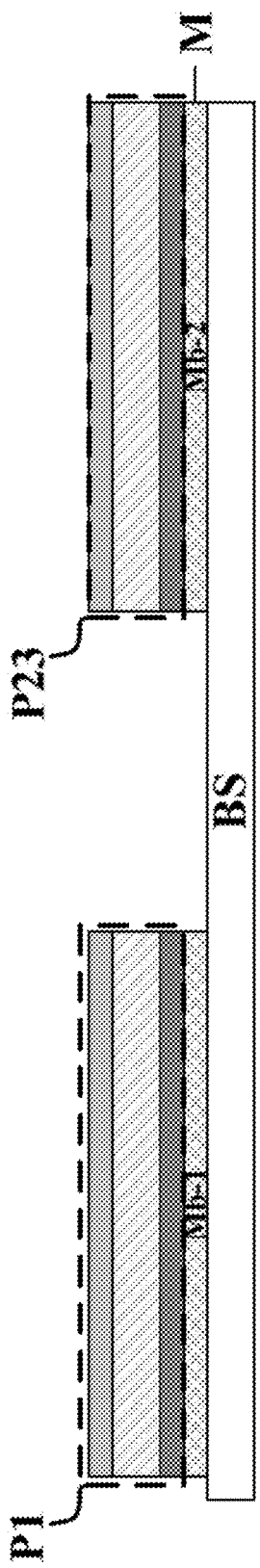
FIGS. 11A to 11H illustrate a process of fabricating a display substrate in some embodiments according to the present disclosure.

FIGS. 11A to 11H illustrate a process of fabricating a display substrate in some embodiments according to the present disclosure. Referring to FIG. 11A, a light shielding layer M (e.g., made of a metallic material) is formed on a base substrate BS. The light shielding layer M is formed to include a plurality of first light shielding blocks Mb-1 and a plurality of second light shielding blocks Mb-2. Subsequently, a plurality of semiconductor junctions, including a plurality of first semiconductor junctions P1 and a plurality of fourth semiconductor junctions P23, are formed on a side of the light shielding layer M distal to the base substrate BS. Specifically, each individual one of the plurality of first semiconductor junctions P1 is formed on a side of a respective one of the plurality of first light shielding blocks Mb-1 distal to the base substrate BS. An orthographic projection of each individual one of the plurality of first semiconductor junctions P1 on the base substrate BS at least partially overlapped with (e.g., completely overlap with) an orthographic projection of the respective one of the plurality of first light shielding blocks Mb-1 on the base substrate BS. Each individual one of the plurality of fourth semiconductor junctions P23 is formed on a side of a respective one of the plurality of second light shielding blocks Mb-2 distal to the base substrate BS. An orthographic projection of each individual one of the plurality of fourth semiconductor junctions P23 on the base substrate BS at least partially overlapped with (e.g., completely overlap with) an orthographic projection of the respective one of the plurality of second light shielding blocks Mb-2 on the base substrate BS. Optionally, the plurality of first light shielding blocks Mb-1, the plurality of second light shielding blocks Mb-2, the plurality of first semiconductor junctions P1, and the plurality of fourth semiconductor junctions P23 are patterned in a single patterning process. For example, the light shielding material layer and the semiconductor junction materials layers are deposited on the base substrate BS, and patterned using a single mask plate.

Figure 11B:
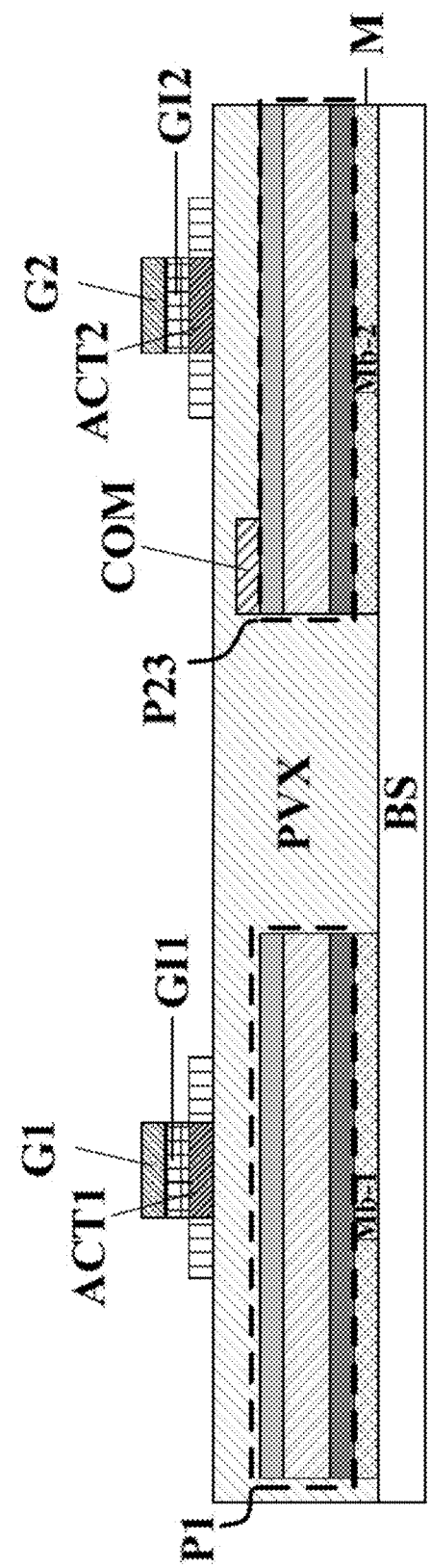

Referring to FIG. 11B, a common electrode COM is formed on aside of the plurality of fourth semiconductor junction P23 distal to the base substrate BS. The common electrode COM is formed to be electrically connected to a first polarity region of the plurality of fourth semiconductor junction P23. A passivation layer PVX is formed on a side of the common electrode COM, the plurality of first semiconductor junctions P1, and the plurality of fourth semiconductor junctions P23 distal to the base substrate BS. Subsequently, first active layers ACT1 of a plurality of first thin film transistors for driving light emission of the display substrate are formed on a side of the passivation layer PVX distal to the base substrate BS, and second active layers ACT2 of a plurality of second thin film transistors are formed on a side of the passivation layer PVX distal to the base substrate BS. A first gate insulating layer GI1 and a second gate insulating layer GI2 are respectively formed on a side of the first active layers ACT1 and the second active layers ACT2 distal to the base substrate BS. A first gate electrode G1 and a second gate electrode G2 are respectively formed on a side of the first gate insulating layer GI1 and the second gate insulating layer GI2 distal to the base substrate BS.

Figure 11C:
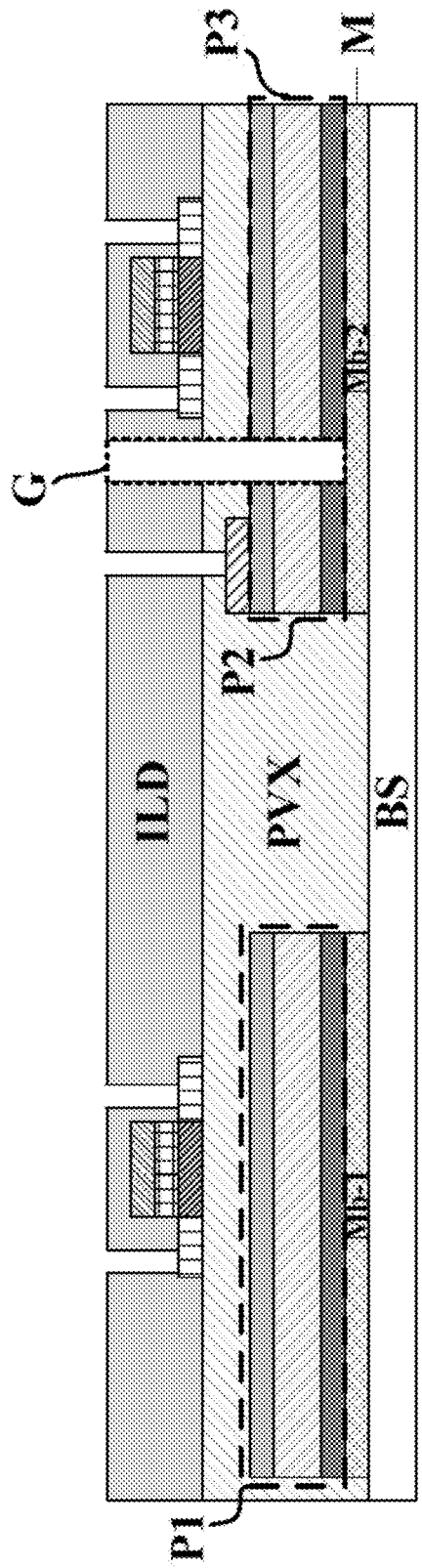

Referring to FIG. 11C, an inter-layer dielectric layer ILD is formed on aside of the first gate electrode G1, the second gate electrode G2, the first active layers ACT1, and the second active layers ACT2 distal to the passivation layer PVX. A plurality of vias are formed to extend through the inter-layer dielectric layer ILD. A groove G is formed to extend through the inter-layer dielectric layer ILD, the passivation layer PVX, one of the plurality of fourth semiconductor junctions P23, exposing a surface of one of the plurality of second light shielding blocks Mb-2. The groove G is formed to divide each individual one of the plurality of fourth semiconductor junctions P23 into two portions, thereby forming one of a plurality of second semiconductor junctions P2 and one of a plurality of third semiconductor junctions P3. The plurality of second semiconductor junctions P2 are formed to be respectively adjacent to the plurality of third semiconductor junctions P3. Each individual one of the plurality of second semiconductor junctions P2 is spaced apart and insulated from a respective one of the plurality of third semiconductor junctions P3 by the groove G, as shown in FIG. 11C.

Figure 11D:
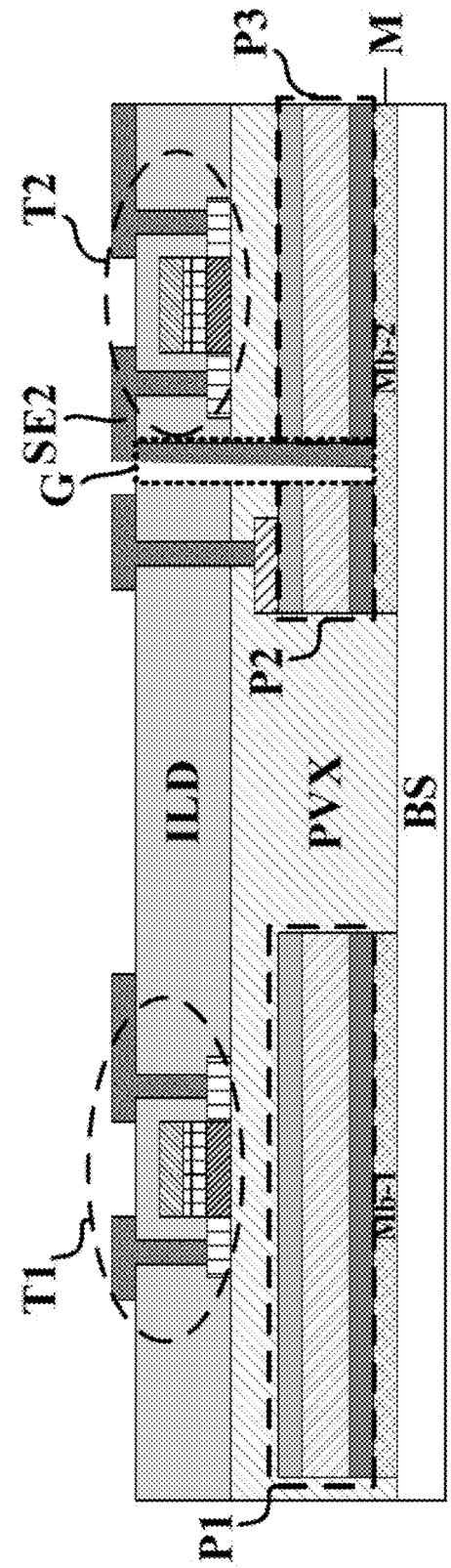

Referring to FIG. 11D, first source electrodes SE1 and first drain electrodes DE1 of the plurality of first thin film transistors, and second source electrodes SE2 and second drain electrodes DE2 of the plurality of second thin film transistors are formed, thereby forming the plurality of first thin film transistors T1 and the plurality of second thin film transistors T2. The second source electrodes SE2 of the plurality of second thin film transistors T2 are formed to extend through the groove G, thereby respectively electrically connected with the plurality of second light shielding blocks Mb-2. The second source electrodes SE2 are formed by depositing a conductive material into the groove G. Subsequently, the conductive material in the groove G is then partially removed thereby separating the second source electrodes SE2 respectively from lateral sides of the plurality of second semiconductor junctions P2. The second source electrodes SE2 are not in contact with the plurality of second semiconductor junctions P2. Optionally, an orthographic projection of the source electrode SE2 of each individual one of the plurality of second thin film transistors T2 on the base substrate BS is substantially non-overlapping with an orthographic projection of the respective one of the plurality of second semiconductor junctions P2 on the base substrate BS.

Figure 11E:
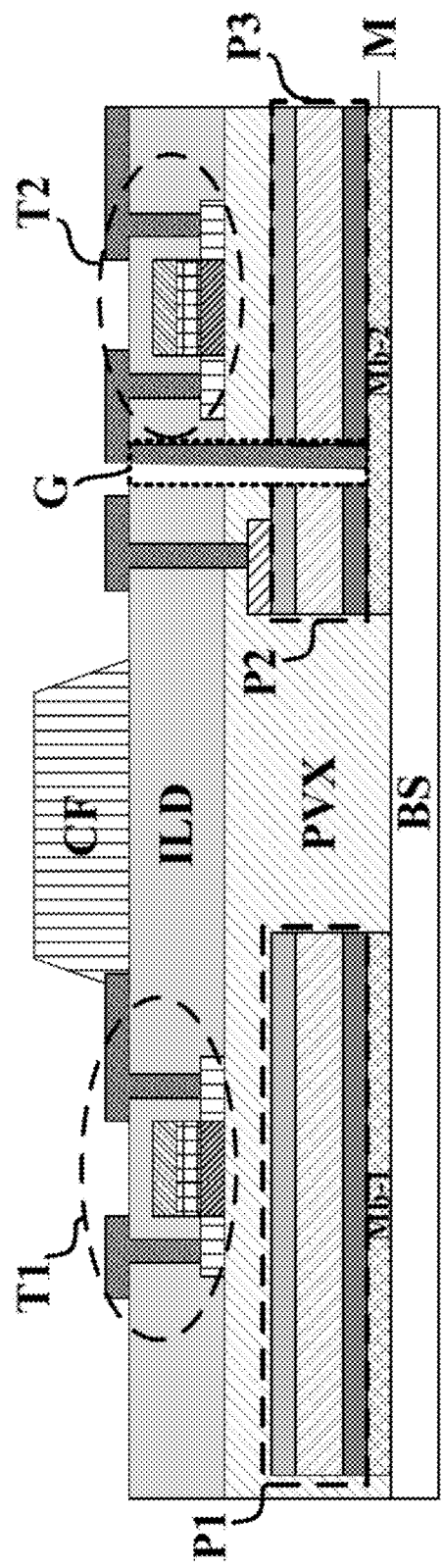

Referring to FIG. 11E, a color filter CF is formed on aside of the inter-layer dielectric layer ILD distal to the base substrate BS. The color filter CF is formed so that an orthographic projection of the color filter CF on the base substrate BS is substantially non-overlapping with orthographic projections of the plurality of second semiconductor junctions P2 on the base substrate BS.

Figure 11F:
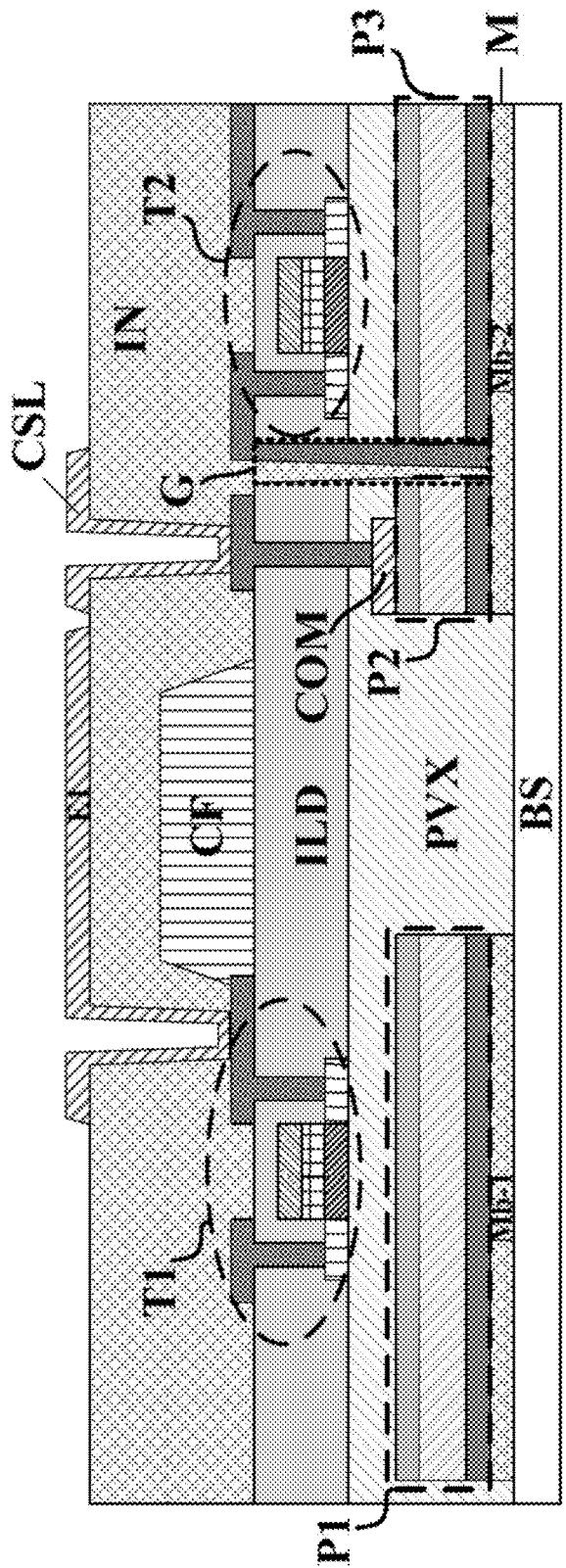

Referring to FIG. 11F, an insulating layer IN is formed on a side of the color filter CF, the plurality of first thin film transistors T1, and the plurality of second thin film transistors 12 distal to the base substrate BS. The insulating layer IN is formed to extend into the groove G, thereby insulating each individual one of the plurality of second semiconductor junctions P2 from the respective one of the plurality of third semiconductor junctions P3. A first electrode E1 (e.g., an anode) is formed on a side of the insulating layer IN distal to the base substrate BS. The color filter CF and the first electrode E1 are formed in a subpixel region of the display substrate. A common electrode signal line CSL configured to provide a common voltage to the common electrode COM is formed on a side of the insulating layer IN distal to the base substrate BS. The common electrode signal line CSL is formed to be electrically connected to the common electrode COM through vias extending through the insulating layer IN and the passivation layer PVX.

Figure 11G:
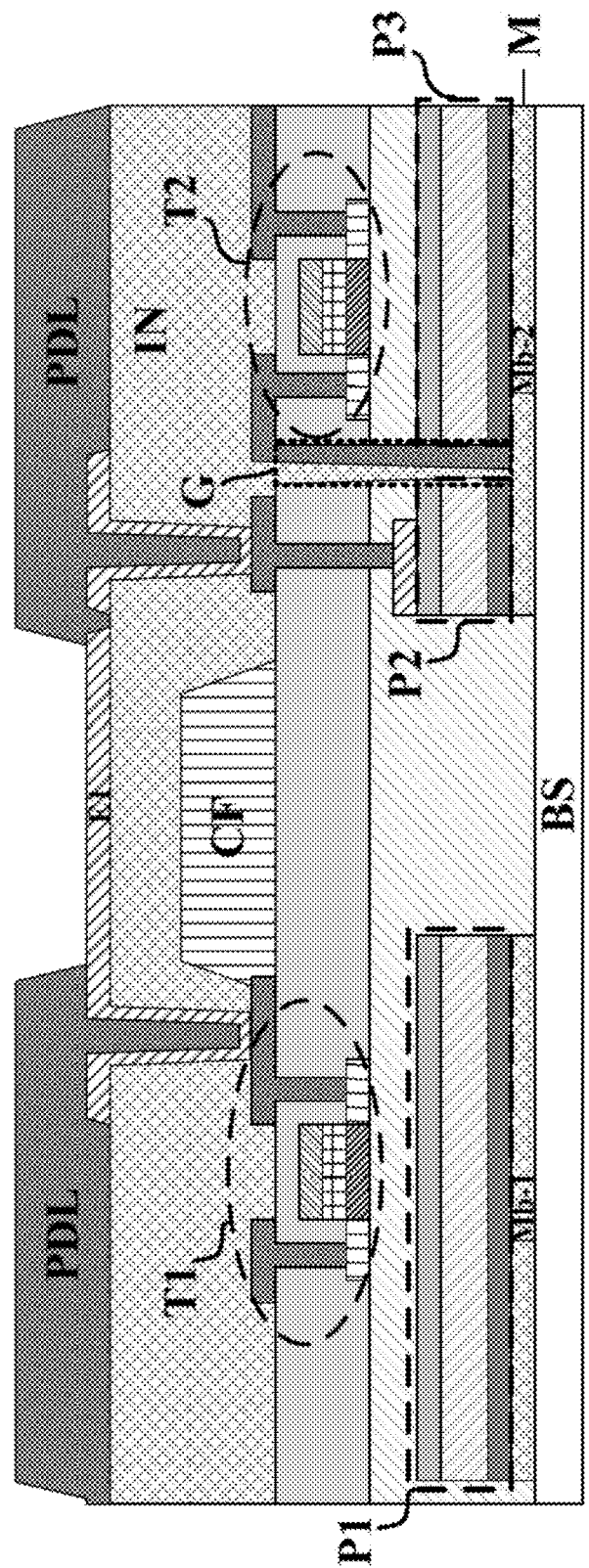
Figure 11H:
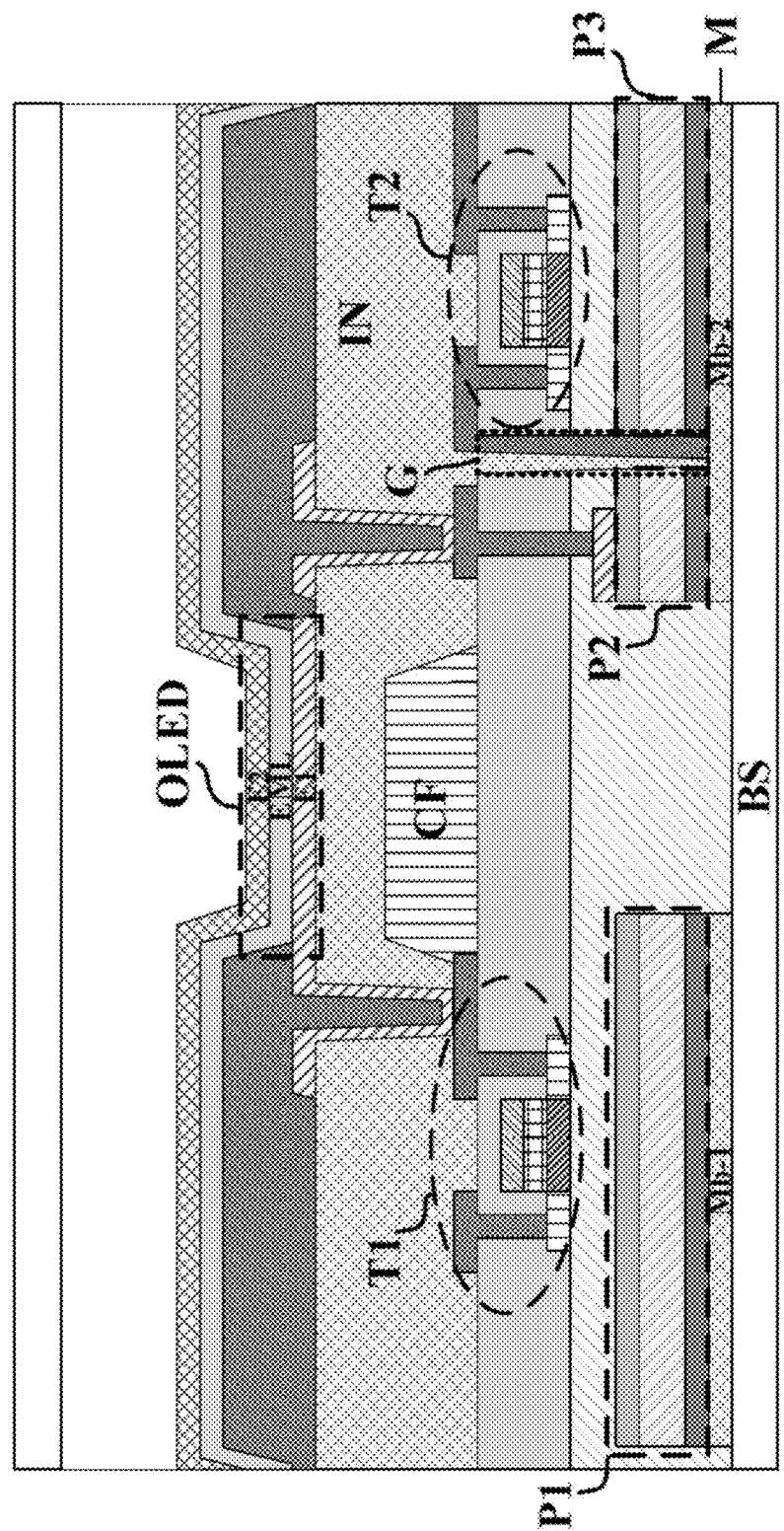

Referring to FIG. 11G, a pixel definition layer PDL is formed to define a plurality of subpixel regions. Referring to FIG. 11H, a light emitting layer EML and a second electrode E2 (e.g., a cathode) are sequentially formed on a side of the first electrode E1 distal to the base substrate BS, thereby forming a plurality of organic light emitting diodes (OLED).

In another aspect, the present disclosure provides a method of fabricating a display panel having a plurality of subpixels. In some embodiments, the method includes forming a display substrate as described herein, forming a second display substrate facing the display substrate as described herein, and assembling the display substrate and the second display substrate together. Optionally, the method further includes forming a compensation circuit connected to the plurality of read lines, and configured to adjust in real time the actual light emitting brightness values of the plurality of subpixel areas to target brightness values.

In another aspect, the present disclosure provides a method of fabricating a display apparatus having a plurality of subpixels. In some embodiments, the method includes forming a display panel as described herein. Optionally, the method further includes forming a compensation circuit connected to the plurality of read lines, and configured to adjust in real time the actual light emitting brightness values of the plurality of subpixel areas to target brightness values.

In another aspect, the present disclosure provides a display panel including the display substrate described herein or fabricated by a method described herein. Optionally, the display panel is an organic light emitting diode display panel having a plurality of organic light emitting diodes. Optionally, the plurality of light emitting brightness value detectors are configured to detect light emitting brightness values of the plurality of organic light emitting diodes respectively. Optionally, the display panel is a quantum dots light emitting diode display panel having a plurality of quantum dots light emitting diodes. Optionally, the plurality of light emitting brightness value detectors are configured to detect light emitting brightness values of the plurality of quantum dots light emitting diodes respectively. Optionally, the display panel is a micro light emitting diode display panel having a plurality of micro light emitting diodes. Optionally, the plurality of light emitting brightness value detectors are configured to detect light emitting brightness values of the plurality of micro light emitting diodes respectively. Optionally, the display panel is a liquid crystal display panel. Optionally, the plurality of light emitting brightness value detectors are configured to detect light emitting brightness values of a plurality of subpixels in the liquid crystal display panel respectively.

Optionally, the display panel is a top-emission type display panel, e.g., a top-emission type organic light emitting diode display panel. Optionally, the display panel is a bottom-emission type display panel, e.g., a bottom-emission type organic light emitting diode display panel. Optionally, the display panel is a dual-emission type display panel, e.g., a dual-emission type organic light emitting diode display panel.

In another aspect, the present disclosure provides a display apparatus including the display panel described herein. Optionally, the display apparatus further includes a compensation circuit configured to receive in real time the light emitting brightness values of the plurality of subpixel areas, and configured to adjust in real time the light emitting brightness values of the plurality of subpixel areas to the target brightness values. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate having a plurality of subpixel areas, comprising:
    a base substrate;
    a plurality of thin film transistors on the base substrate;
    a plurality of semiconductor junctions configured to shield light from irradiating on active layers of the plurality of thin film transistors; and
    a plurality of light emitting brightness value detectors including a plurality of second thin film transistors respectively electrically connected to a plurality of second semiconductor junctions;
    wherein the plurality of second semiconductor junctions are respectively configured to detect light emitting brightness values in a plurality of subpixel areas of the display substrate, respectively.

2. The display substrate of claim 1, wherein orthographic projections of at least some of the plurality of semiconductor junctions on the base substrate respectively cover orthographic projections of the active layers of the plurality of thin film transistors on the base substrate.

3. The display substrate of claim 1, wherein at least some of the plurality of semiconductor junctions are respectively on a side of the active layers of the plurality of thin film transistors facing the base substrate.

4. The display substrate of claim 1, further comprising a light shielding layer;
    wherein the light shielding layer and the plurality of semiconductor junctions are configured to cooperatively shield light from irradiating on the active layers of the plurality of thin film transistors.

5. The display substrate of claim 4, wherein an orthographic projection of the light shielding layer on the base substrate covers orthographic projections of the active layers of the plurality of thin film transistors on the base substrate; and
    orthographic projections of at least some of the plurality of semiconductor junctions on the base substrate respectively cover orthographic projections of the active layers of the plurality of thin film transistors on the base substrate.

6. The display substrate of claim 1, wherein the plurality of thin film transistors comprises an array of a plurality of first thin film transistors on the base substrate and respectively in the plurality of subpixel areas for driving light emission of the display substrate;
    wherein the plurality of semiconductor junctions comprises a plurality of first semiconductor junctions respectively in the plurality of subpixel areas; and
    orthographic projections of the plurality of first semiconductor junctions on the base substrate respectively covers orthographic projections of first active layers of the plurality of first thin film transistors on the base substrate.

7. The display substrate of claim 1, further comprising a light shielding layer;
    wherein the light shielding layer comprises a plurality of first light shielding blocks respective in the plurality of subpixel areas;
    wherein the plurality of thin film transistors comprises an array of a plurality of first thin film transistors on the base substrate and respectively in the plurality of subpixel areas for driving light emission of the display substrate; and
    orthographic projections of the plurality of first light shielding blocks on the base substrate respectively covers orthographic projections of first active layers of the plurality of first thin film transistors on the base substrate;
    wherein the plurality of semiconductor junctions comprises a plurality of first semiconductor junctions respectively in the plurality of subpixel areas; and
    the plurality of first semiconductor junctions and the plurality of first light shielding blocks are configured to cooperatively shield light from irradiating on the first active layers of the plurality of first thin film transistors.

8. The display substrate of claim 1, further comprising a light shielding layer;
    wherein orthographic projections of the plurality of second semiconductor junctions on the base substrate respectively covers orthographic projections of second active layers of the plurality of second thin film transistors on the base substrate;
    the light shielding layer comprises a plurality of second light shielding blocks;
    orthographic projections of the plurality of second light shielding blocks on the base substrate respectively covers orthographic projections of the second active layers of the plurality of second thin film transistors on the base substrate; and
    the plurality of second semiconductor junctions and the plurality of second light shielding blocks are configured to cooperatively shield light from irradiating on the second active layers of the plurality of second thin film transistors.

9. The display substrate of claim 8, wherein the plurality of second light shielding blocks are respectively electrically connected to source electrodes of the plurality of second thin film transistors, and are respectively electrically connected to the plurality of second semiconductor junctions.

10. The display substrate of claim 1, wherein the plurality of semiconductor junctions further comprises a plurality of third semiconductor junctions; and orthographic projections of the plurality of third semiconductor junctions on the base substrate respectively covers orthographic projections of second active layers of the plurality of second thin film transistors on the base substrate.

11. The display substrate of claim 10, further comprising a light shielding layer;

wherein the light shielding layer comprises a plurality of third light shielding blocks;

orthographic projections of the plurality of third light shielding blocks on the base substrate respectively covers orthographic projections of the second active layers of the plurality of second thin film transistors on the base substrate; and the plurality of third semiconductor junctions and the plurality of third light shielding blocks are configured to cooperatively shield light from irradiating on the second active layers of the plurality of second thin film transistors.

12. The display substrate of claim 1, further comprising a light shielding layer;

wherein the plurality of semiconductor junctions further comprises a plurality of third semiconductor junctions;

orthographic projections of the plurality of third semiconductor junctions on the base substrate respectively covers orthographic projections of second active layers of the plurality of second thin film transistors on the base substrate;

the light shielding layer comprises a plurality of second light shielding blocks;

orthographic projections of the plurality of second light shielding blocks on the base substrate respectively covers orthographic projections of the second active layers of the plurality of second thin film transistors on the base substrate;

the orthographic projections of the plurality of second light shielding blocks on the base substrate at least partially respectively overlap with orthographic projections of the plurality of second semiconductor junctions on the base substrate;

the plurality of third semiconductor junctions and the plurality of second light shielding blocks are configured to cooperatively shield light from irradiating on the second active layers of the plurality of second thin film transistors.

13. The display substrate of claim 12, wherein the plurality of second light shielding blocks are respectively electrically connected to source electrodes of the plurality of second thin film transistors, and are respectively electrically connected to the plurality of second semiconductor junctions.

14. The display substrate of claim 12, wherein the plurality of second semiconductor junctions are respectively adjacent to the plurality of third semiconductor junctions;

each individual one of the plurality of second semiconductor junctions is spaced apart and insulated from a respective one of the plurality of third semiconductor junctions.

15. The display substrate of claim 14, wherein each individual one of the plurality of second semiconductor junctions is spaced apart from the respective one of the plurality of third semiconductor junctions by a groove;

wherein the display substrate further comprises an insulating layer extending into the groove, thereby insulating each individual one of the plurality of second semiconductor junctions from the respective one of the plurality of third semiconductor junctions;

wherein a source electrode of each individual one of the plurality of second thin film transistors is electrically connected to a respective one of the plurality of second light shielding blocks through the groove;

the insulating layer insulates the source electrode from a respective one of the plurality of second semiconductor junctions; and the plurality of second light shielding blocks are respectively electrically connected to source electrodes of the plurality of second thin film transistors, and are respectively electrically connected to the plurality of second semiconductor junctions.

16. The display substrate of claim 15, wherein an orthographic projection of the source electrode of each individual one of the plurality of second thin film transistors on the base substrate is substantially non-overlapping with an orthographic projection of the respective one of the plurality of second semiconductor junctions on the base substrate.

17. The display substrate of claim 1, further comprising a color filter;

wherein an orthographic projection of the color filter on the base substrate is substantially non-overlapping with orthographic projections of the plurality of second semiconductor junctions on the base substrate.

18. A display panel, comprising the display substrate of claim 1.

19. A method of fabricating a display substrate having a plurality of subpixel areas, comprising:

forming a plurality of thin film transistors on a base substrate;

forming a light shielding layer;

forming a plurality of semiconductor junctions; and forming a plurality of light emitting brightness value detectors including a plurality of second thin film transistors respectively electrically connected to a plurality of second semiconductor junctions;

wherein the light shielding layer and the plurality of semiconductor junctions are formed to cooperatively shield light from irradiating on active layers of the plurality of thin film transistors; and the plurality of second semiconductor junctions are respectively configured to detect light emitting brightness values in a plurality of subpixel areas of the display substrate, respectively.

* * * * *